(12) United States Patent
Park

(10) Patent No.: US 11,641,781 B2
(45) Date of Patent: May 2, 2023

(54) DISPLAY APPARATUS

(71) Applicant: LG ELECTRONICS INC., Seoul (KR)

(72) Inventor: Jongha Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1143 days.

(21) Appl. No.: 15/806,147

(22) Filed: Nov. 7, 2017

(65) Prior Publication Data

US 2018/0198052 A1 Jul. 12, 2018

Related U.S. Application Data

(60) Provisional application No. 62/418,809, filed on Nov. 8, 2016.

(30) Foreign Application Priority Data

Jan. 26, 2017 (KR) .................. 10-2017-0012502

(51) Int. Cl.
*H01L 41/09* (2006.01)
*H05K 5/00* (2006.01)
(Continued)

(52) U.S. Cl.
CPC ............... *H01L 41/09* (2013.01); *B06B 1/06* (2013.01); *G06F 1/1605* (2013.01);
(Continued)

(58) Field of Classification Search
CPC ..... H04R 2499/15; H04R 17/00; H01L 41/09; H01L 41/0533; H01L 41/06; H01L 41/186; H01L 41/183; H01L 41/18
See application file for complete search history.

(56) References Cited

U.S. PATENT DOCUMENTS 6,389,302 B1 5/2002 Mance
9,985,195 B2 * 5/2018 Mori .................. B06B 1/0603
(Continued)

FOREIGN PATENT DOCUMENTS

CN 1670934 9/2005
CN 103092336 5/2013
(Continued)

OTHER PUBLICATIONS

PCT International Application No. PCT/KR2017/012537, International Search Report dated Mar. 15, 2018, 3 pages.
(Continued)

*Primary Examiner* — Shawki S Ismail
*Assistant Examiner* — Karen B Addison
(74) *Attorney, Agent, or Firm* — Lee, Hong, Degerman, Kang & Waimey PC

(57) ABSTRACT

A display apparatus is disclosed. The display apparatus includes a display panel, a piezoelectric vibration unit attached to a rear surface of the display panel, and a member attached to at least one of a rear surface of the piezoelectric vibration unit and a portion of the rear surface of the display panel that surrounds the piezoelectric vibration unit. The display apparatus includes a display panel, a damping member attached to a rear surface of the display panel, and a piezoelectric vibration unit attached to a rear surface of the damping member.

24 Claims, 23 Drawing Sheets

(51) Int. Cl.
  *G06F 3/01* (2006.01)
  *H01L 41/053* (2006.01)
  *H05K 5/03* (2006.01)
  *B06B 1/06* (2006.01)
  *H04R 17/00* (2006.01)
  *H04M 1/03* (2006.01)
  *H04R 1/26* (2006.01)
  *H01L 41/187* (2006.01)
  *G06F 1/16* (2006.01)
  *H04R 7/04* (2006.01)
  *H04M 1/02* (2006.01)

(52) U.S. Cl.
  CPC .......... *G06F 1/1626* (2013.01); *G06F 1/1637* (2013.01); *G06F 1/1684* (2013.01); *G06F 1/1688* (2013.01); *G06F 3/01* (2013.01); *G06F 3/016* (2013.01); *H01L 41/053* (2013.01); *H01L 41/0533* (2013.01); *H01L 41/1876* (2013.01); *H04M 1/0266* (2013.01); *H04R 7/045* (2013.01); *H04R 17/00* (2013.01); *H05K 5/0017* (2013.01); *H05K 5/03* (2013.01); *H04M 1/03* (2013.01); *H04R 1/26* (2013.01); *H04R 2400/03* (2013.01); *H04R 2440/05* (2013.01); *H04R 2499/11* (2013.01); *H04R 2499/15* (2013.01)

(56) References Cited

U.S. PATENT DOCUMENTS

2006/0227981 A1  10/2006  Miyata
2012/0139851 A1  6/2012   Kim et al.
2013/0106239 A1  5/2013   Yun et al.
2014/0346926 A1* 11/2014  Choi .................. H01L 41/0933
                                                    310/323.01

FOREIGN PATENT DOCUMENTS

| CN | 104184360    | 12/2014 |
| CN | 105096778    | 11/2015 |
| EP | 2941015      | 11/2015 |
| KR | 1020120014538 | 2/2012  |
| KR | 1020120063344 | 6/2012  |
| KR | 101648863    | 8/2016  |
| WO | 199717818    | 5/1997  |

OTHER PUBLICATIONS

State Intellectual Property Office of the People's Republic of China Application Serial No. 201780082638.6, Office Action dated Mar. 2, 2020, 8 pages.

European Patent Office Application Serial No. 17869924.5, Search Report dated Apr. 29, 2020, 7 pages.

The State Intellectual Property Office of the People's Republic of China Application Serial No. 201780082638.6, Office Action dated Jun. 4, 2021, 6 pages.

European Patent Office Application Serial No. 17869924.5, Office Action dated Aug. 3, 2021, 7 pages.

The State Intellectual Property Office of the People's Republic of China Application Serial No. 201780082638.6, Office Action dated Jan. 25, 2021, 6 pages.

* cited by examiner

| W(g)  | 0.0 | 2.5 | 5.0 | 10.0 | 20.0 | 30.0 | 40.0 |
|-------|-----|-----|-----|------|------|------|------|
| L(dB) | 0.0 | 2.3 | 3.3 | 5.8  | 7.4  | 8.2  | 7.9  |
| H(dB) | 0.0 | 1.9 | 2.3 | 2.2  | 2.8  | 3.0  | 2.7  |

| W(g) | 0.0 | 2.5 | 5.0 | 10.0 | 20.0 | 30.0 | 40.0 |
|---|---|---|---|---|---|---|---|
| L(dB) | 0.0 | 0.6 | 0.6 | 1.0 | 1.8 | 1.8 | 0.3 |
| H(dB) | 0.0 | -1.7 | -4.4 | -5.1 | -5.4 | -6.2 | -6.5 |

DISPLAY APPARATUS

CROSS-REFERENCE TO RELATED APPLICATION

Pursuant to 35 U.S.C. § 119, this application claims the benefit of earlier filing date and right of priority to Korean Application No(s). 10-2017-0012502, filed on Jan. 26, 2017, and also claims the benefit of U.S. Provisional Application No. 62/418,809, filed on Nov. 8, 2016, the contents of which are all hereby incorporated by reference herein in their entirety.

BACKGROUND OF THE INVENTION

1. Field of the Invention

The present invention relates to a display apparatus that generates vibration.

2. Description of the Related Art

There are various kinds of display panels for generating images, for example, liquid crystal displays (LCDs), plasma display panels (PDPs), electro-luminescent displays (ELDs), vacuum fluorescent displays (VFDs), organic light-emitting diode (OLED) displays, etc.

A display apparatus, equipped with a display panel and a vibration unit for generating vibration, has been developed. The vibration unit refers to a sound output device (e.g. a speaker) or a haptic device (e.g. a linear motor) that enables a user to feel tactile vibration.

Representative examples of the vibration unit include a moving-coil device (e.g. a moving-coil speaker), which generates vibration energy by applying current to a coil, and a piezoelectric vibration device (e.g. a piezoelectric actuator), which generates vibration energy using the piezoelectric effect.

The piezoelectric effect is the ability of certain materials, such as ceramics, etc., to generate an electric charge when mechanical stress is applied thereto, and, conversely, to expand or contract when electrical energy is applied thereto. As materials used to manufacture a piezoelectric vibration device, lead zirconate titanate (Pb(Ti, Zr)O3)(PZT), barium titanate (BaTiO3), lead titanate (PbTiO3), lithium niobate (LiNbO3), quartz (SiO2), etc. are well known.

In a conventional display apparatus, a diaphragm for a device for generating acoustic or tactile vibration (the moving-coil device or the piezoelectric vibration device) is disposed so as to be spaced apart from the display panel.

It is known that the audible frequency range of a human being is from 20 Hz to 20,000 Hz and that the frequency of sounds generated in daily life does not usually exceed 10,000 Hz. When the relatively high range within the frequency range of from 20 Hz to 16,000 Hz is defined as a high frequency range and the relatively low range is defined as a low frequency range, human voice in daily life belongs to the low frequency range. Further, the frequency that a human being can perceive using the sense of touch also belongs to the low frequency range.

It is possible to manufacture a lighter and smaller piezoelectric vibration device than a moving-coil device. However, the magnitude of the output in the low frequency range of the piezoelectric vibration device is smaller than that of the moving-coil device.

SUMMARY OF THE INVENTION

The prior art has a problem in that the immersion level of a viewer is decreased due to a gap between a display panel for outputting images and a position at which vibration is generated by a vibration device. It is a first object of the present invention to solve this problem with the prior art and to increase the immersion level of a viewer.

The prior art has a problem in that the realism of an image is degraded due to a long distance between a sound generation position in the image that a viewer visually recognizes (e.g. a person's mouth in the image) and a position from which a sound that the viewer acoustically perceives comes (a sound image). It is a second object of the present invention to solve this problem with the prior art and to minimize the distance between the visual sound generation position and the acoustical sound generation position.

In the prior art, when a user touches a display panel of a display apparatus, which is put in a case, to generate vibration (for example, when a user grabs a smartphone with one hand and touches a display panel of the smartphone with the other hand), the magnitude of the tactile vibration that the user feels at the contact point between the display panel and the user is smaller than the magnitude of the tactile vibration that the user feels at the contact point between the case and the user. Therefore, the prior art has a problem in that the correlation between the image and the vibration is reduced and a disconnect between the image and the vibration occurs. It is a third object of the present invention to solve this problem with the prior art and to minimize the distance between the visual vibration generation position (the position of the image) and the tactile vibration generation position.

The prior art has a problem in that the magnitude of the output in the low frequency range of the piezoelectric vibration device is relatively small. It is a fourth object of the present invention to solve this problem with the prior art.

The prior art has a problem in that a moving-coil device having a large volume must be used to remarkably increase the magnitude of the output in the low frequency range, leading to an increase in the volume or the thickness of the display apparatus. It is a fifth object of the present invention to solve this problem with the prior art.

It is a sixth object of the present invention to further increase the magnitude of the vibration output in the low frequency range for a given applied voltage.

It is a seventh object of the present invention to prevent the reduction of the efficiency of the vibration output in the high frequency range or to increase the efficiency of the vibration output in the high frequency range while accomplishing the above objects.

It is an eighth object of the present invention to minimize the thickness of the display apparatus in the front-rear direction while accomplishing the above objects.

The prior art has a problem in that the magnitude of the output of the vibration-generating device is sharply increased or decreased (fluctuation of a peak and dip amplitude) in some frequency ranges in comparison with other, adjacent, frequency ranges. It is a ninth object of the present invention to solve this problem with the prior art.

It is a tenth object of the present invention to provide a display apparatus having a neat appearance, improved durability and excellent efficiency of sound output while accomplishing at least some of the above objects.

It is an eleventh object of the present invention to uniformly apply factors designed to influence the vibration output to the entire area of the sound-generating region.

However, objects to be accomplished by the invention are not limited to the above-mentioned objects, and other objects not mentioned will be clearly understood by those skilled in the art from the following description.

In accordance with an aspect of the present invention, the above and other objects can be accomplished by the provision of a display apparatus including a display panel, at least one piezoelectric vibration unit comprising a first side coupled to a rear side of the display panel, and a member attached to at least a second side of the piezoelectric vibration unit opposite the first side or a portion of the rear side of the display panel surrounding the piezoelectric vibration unit.

The member may be attached to the second side of the piezoelectric vibration unit.

The member may be attached only to the second side of the piezoelectric vibration unit.

The member may be attached to a center portion of the second side of the piezoelectric vibration unit.

The member may cover an entire area of the second side of the piezoelectric vibration unit.

The weight of the member attached only to the second side may be in a range of 15 g to 45 g. The weight of the member attached only to the second side may be 25 g or more. The weight of the member attached only to the second side may be 35 g or less.

The member may not be attached to the second side of the piezoelectric vibration unit.

The member not attached to the second side may be laterally positioned adjacent to at least two sides of the piezoelectric vibration unit.

The member not attached to the second side may be laterally positioned adjacent to at least two opposite sides of the piezoelectric vibration unit.

The member not attached to the second side may be laterally positioned adjacent to all sides of the piezoelectric vibration unit.

The weight of the member not attached to the second side may be in a range of 7.5 g to 35 g. The weight of the member not attached to the second side may be 15 g or more. The weight of the member not attached to the second side may be 25 g or less.

Vibration generated by the piezoelectric vibration unit may be transferred to the display panel and causes the display panel to vibrate.

A first side of the member may be attached to at least the piezoelectric vibration unit or the portion of the rear side of the display panel, and a second side of the member opposite the first side may not contact any other portion of the display apparatus. The member may comprise multiple members.

The piezoelectric vibration unit may be composed of lead zirconate titanate (PZT).

The at least one piezoelectric vibration unit may include a first piezoelectric vibration unit and a second piezoelectric vibration unit spaced apart from each other, and the first piezoelectric vibration unit may be positioned in an upper left quadrant of the display panel and the second piezoelectric vibration unit may be positioned in an upper right quadrant of the display panel.

The first piezoelectric vibration unit may be positioned in a middle region of the upper left quadrant of the display panel and the second piezoelectric vibration unit may be positioned in a middle region of the upper right quadrant of the display panel.

The display apparatus may further comprise a cover comprising an outer portion configured to support a marginal portion of the display panel, wherein an inner portion of the cover is spaced apart from the rear side of the display panel defining a space therebetween. A region of the inner portion of the cover facing the piezoelectric vibration unit may be rearwardly depressed defining an additional space therebetween.

The member may be symmetrical with respect to a center of gravity of the piezoelectric vibration unit.

A center of gravity of the member may be aligned with a center of gravity of the piezoelectric vibration unit.

The display apparatus may further comprise a damping member attached to the rear surface of the display panel, wherein the piezoelectric vibration unit is coupled to the display panel via the damping member interposed between the piezoelectric vibration unit and the display panel.

The damping member may comprise two or more damping layers composed of two or more different materials.

BRIEF DESCRIPTION OF THE DRAWINGS

The above and other objects, features and other advantages of the present invention will be more clearly understood from the following detailed description taken in conjunction with the accompanying drawings, in which:

FIG. 8a illustrates one embodiment 311 of a side cover 310, FIG. 8b illustrates another embodiment 312 of the side cover 310, FIG. 8c illustrates a further embodiment 313 of the side cover 310, and FIG. 8d illustrates another further embodiment 314 of the side cover 310;

FIGS. 9a, 9b, 9c, 9d and 9e illustrate experimental graphs of type A depicted in FIG. 3 according to an arrangement position (a rear plan view) of a member 61 having a weight W of 20 g;

FIGS. 10a, 10b and 10c illustrate experimental graphs of type B depicted in FIG. 3 according to an arrangement position (a rear plan view) of a member 62 having a weight W of 20 g;

FIG. 11 illustrates an experimental graph of type C depicted in FIG. 3 in which a member 63 having a weight W of 20 g is present;

FIGS. 12a, 12b, 12c, 12d, 12e and 12f illustrate experimental graphs of type A depicted in FIG. 3 according to a weight W (2.5 g, 5 g, 10 g, 20 g, 30 g and 40 g) of the member 61 without variation in the arrangement position thereof (a rear plan view);

FIGS. 14a, 14b, 14c, 14d, 14e and 14f illustrate experimental graphs of type B depicted in FIG. 3 according to a weight W (2.5 g, 5 g, 10 g, 20 g, 30 g and 40 g) of the member 62 without variation in the arrangement position thereof (a rear plan view);

FIGS. 16a and 16b illustrate experimental graphs of type D depicted in FIG. 3 according to a thickness T (0.2 mm and 0.4 mm) of the damping member 70 without variation in the arrangement position thereof (a rear plan view);

DETAILED DESCRIPTION OF THE PREFERRED EMBODIMENTS

Figure 1:
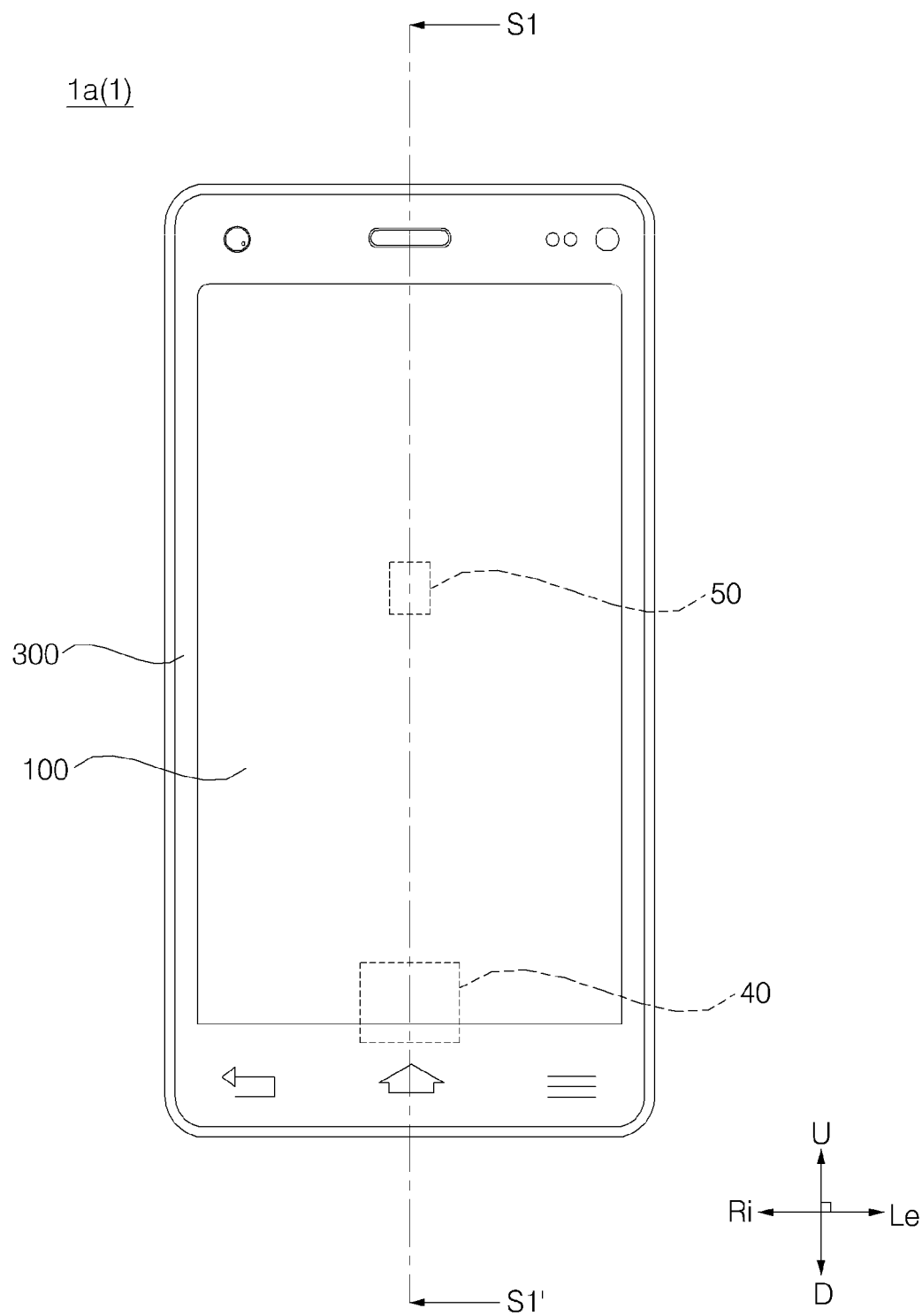
FIG. 1 is a front view of a display apparatus 1a according to one embodiment of the present invention.

Reference will now be made in detail to the preferred embodiments of the present invention, examples of which are illustrated in the accompanying drawings. Wherever possible, the same reference numbers will be used throughout the drawings to refer to the same or like parts.

Terms indicating directions such as "front (F)", "rear (R)", "left (Le)", "right (Ri)", "up (U)", and "down (D)", which will be mentioned below, will be understood on the basis of FIGS. 1 to 8. Specifically, the terms "front" and "rear" are defined such that the direction in which a display panel 100 outputs images is defined as the front. According to this definition, in the case in which the display panel 100 is embodied as a flat display panel like the embodiments of the present invention, the front and the rear are the same over the entire area of the display panel 100, but in the case in which the display panel 100 is embodied as a curved display panel, the front and the rear may vary. This criterion is merely for clearly explaining the present invention, and the respective directions may be defined differently depending on a change in criterion.

In addition, it will be understood that terms "first", "second", "third" and other numerical terms are used herein to describe various elements and are only used to distinguish one element from another element. Thus, these terms are irrelevant to the order, importance or master-servant relationship between the elements. For instance, an invention including only a second element without a first element can be realized.

Referring to FIGS. 1 to 4, a display apparatus 1 according to an embodiment of the present invention comprises a display panel 100 for outputting an image in the forward direction. The display apparatus 1 comprises a piezoelectric vibration unit 50 configured to vibrate due to the piezoelectric effect. The display apparatus 1 comprises a control unit 250 for controlling the image output of the display panel 100. The control unit 250 controls the vibration output of the piezoelectric vibration unit 50. The display apparatus 1 may comprise a cable 260 for transferring control signals from the control unit 250 to the display panel 100. The cable 260 may transfer the control signals from the control unit 250 to the piezoelectric vibration unit 50. The display apparatus 1 may comprise a cover 300 for defining the outer appearance of the display apparatus. The display apparatus 1 may comprise a sub-speaker 40 for outputting a sound. Further, the display apparatus 1 comprises a member 60 and/or a damping member 70, which will be described later.

Figure 2:
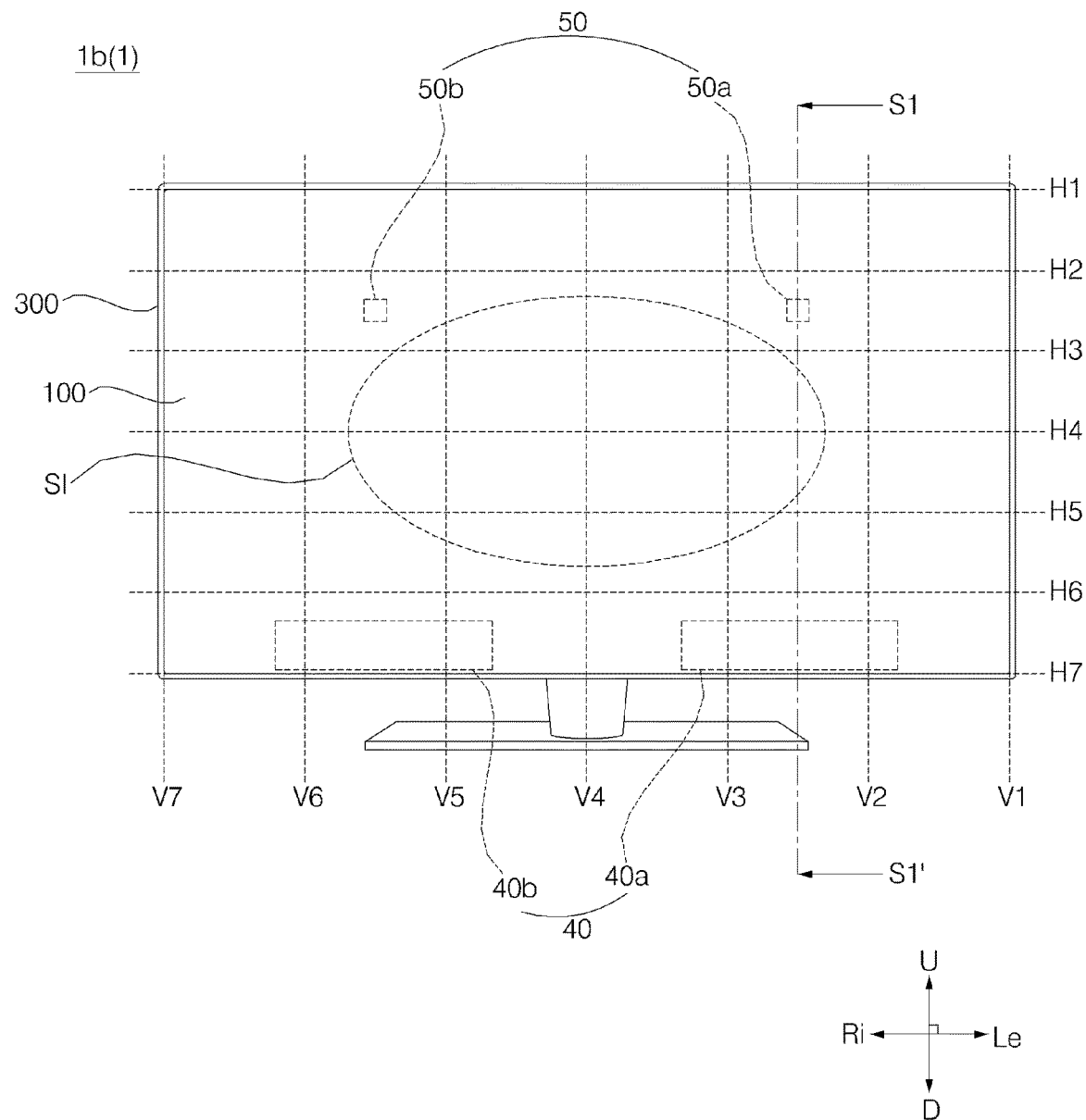
FIG. 2 is a front view of a display apparatus 1b according to another embodiment of the present invention.
Figure 4:
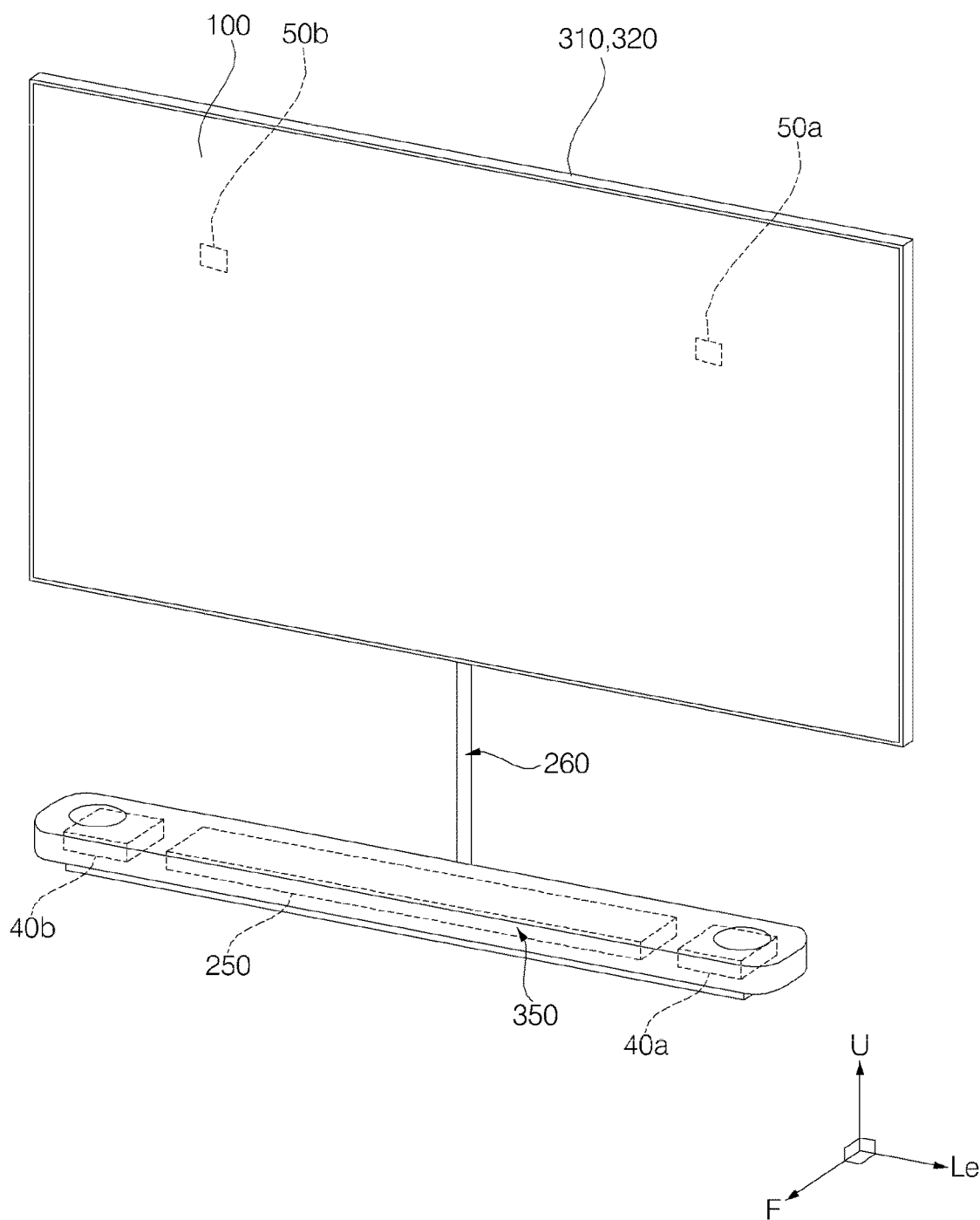
FIG. 4 is a perspective view illustrating a modified example of the display apparatus 1 depicted in FIG. 3.

The present invention is applicable to any kind of image-output device, for example, a portable terminal device 1a such as a smartphone or the like, a laptop computer, a tablet PC, a monitor, a TV 1b and 1b', etc. FIG. 1 illustrates a portable terminal device 1a according to one embodiment of the present invention. FIG. 2 illustrates a stand-type TV 1b according to another embodiment of the present invention. FIGS. 4 and 5 illustrate a wall-mounted TV 1b' according to a further embodiment of the present invention. Hereinafter, the present invention will be described with reference to the TV 1b and 1b'; however the present invention is not limited thereto.

The piezoelectric vibration unit 50 according to the present invention is used to output vibration that is perceived by the sense of hearing (i.e. to output a sound) and/or to output vibration that is perceived by the sense of touch (i.e. to output a haptic effect). In an experimental example, which will be described later, the magnitude (dB) of the output sound according to the frequency is measured in order to determine the output of the piezoelectric vibration unit 50 depending on the frequency, and the experimental result may also be identically derived from the piezoelectric vibration unit 50 for the haptic effect. Although the present invention will be described with reference to the piezoelectric vibration unit 50 for outputting sound, the purpose of the piezoelectric vibration unit 50 is not limited to sound output.

The cover 300 according to this embodiment supports a marginal portion of the display panel 100 and covers the rear surface of the display panel 100. However, in another embodiment (not shown), a folding-type display apparatus 1, in which a flexible display panel 100 is provided without being supported by the cover 300 and in which at least a portion of the rear surface of the display panel 100 is exposed, may be realized.

The display apparatus 1a (e.g. a tablet PC, a smartphone or the like) according to one embodiment of the present invention will now be described in detail with reference to FIGS. 1 and 3. The display apparatus 1a comprises a display panel 100, which is formed such that a height thereof in the vertical direction is longer than a width thereof in the lateral direction. Specifically, the display panel 100 is formed in a quadrangular shape having four sides, two relatively short sides of which are arranged to define the top and bottom sides of the display panel and two relatively long sides of which are arranged to define the left and right sides of the display panel. A piezoelectric vibration unit 50 is attached to the center portion of the rear surface of the display panel 100. There is further provided a cover 300 for covering the rear surface of the display panel 100. The cover 300 supports the marginal portion of the display panel 100. The cover 300 forms an internal space therein, and a sub-speaker 40 for outputting a sound is disposed in the internal space. The piezoelectric vibration unit 50 directly vibrates the display panel 100. When a user touches the front surface of the display panel 100, the piezoelectric vibration unit 50 may generate vibration, and the generated vibration may be transferred to the user's fingertips via the display panel 100. As a result of the piezoelectric vibration unit 50 being attached to the rear surface of the display panel 100, the magnitude of the output vibration that is transferred to the user's one hand, which is in contact with the display panel 100, is larger than the magnitude of the output vibration that is transferred to the other hand, which is in contact with the cover 300.

The display apparatus 1b (e.g. a TV, a monitor or the like) according to another embodiment of the present invention will now be described in detail with reference to FIGS. 2 and 3. The display apparatus 1b comprises a display panel 100, which is formed such that a width thereof in the lateral direction is longer than a height thereof in the vertical direction. Specifically, the display panel 100 is formed in a quadrangular shape having four sides, two relatively short sides of which are arranged to define the left and right sides of the display panel and two relatively long sides of which are arranged to define the top and bottom sides of the display panel. At least one piezoelectric vibration unit 50 generates a sound by directly vibrating the display panel 100. In order to output stereo sound, the at least one piezoelectric vibration unit 50 includes two piezoelectric vibration units 50a and 50b, which are spaced apart from each other and are attached to the rear surface of the display panel 100. There is further provided a cover 300 for covering the rear surface of the display panel 100. The cover 300 supports the marginal portion of the display panel 100. The cover 300 forms an internal space therein, and at least one sub-speaker 40 for outputting a sound may be disposed in the internal space. The at least one sub-speaker 40 may include two sub-speakers 40, which are spaced apart from each other in the lateral direction in order to output stereo sound, and the sub-speakers 40 may be embodied as woofers or the like. As a result of the piezoelectric vibration unit 50 being attached to the rear surface of the display panel 100, the position of the image and the position SI of the output sound (a sound image), which the user perceives from the display panel 100, are substantially identical to each other.

The piezoelectric vibration unit 50 may be provided to generate haptic vibration; however, the piezoelectric vibration unit configured to vibrate for sound output will now be described. Referring to FIG. 3, the piezoelectric vibration unit 50 propagates sound in the forward direction (refer to arrow Sa). The sub-speaker 40 may propagate sound in any one direction among upper, lower, left and right directions (refer to arrow Sb). In this embodiment, the sub-speaker 40 propagates sound in the lower direction.

Figure 3:
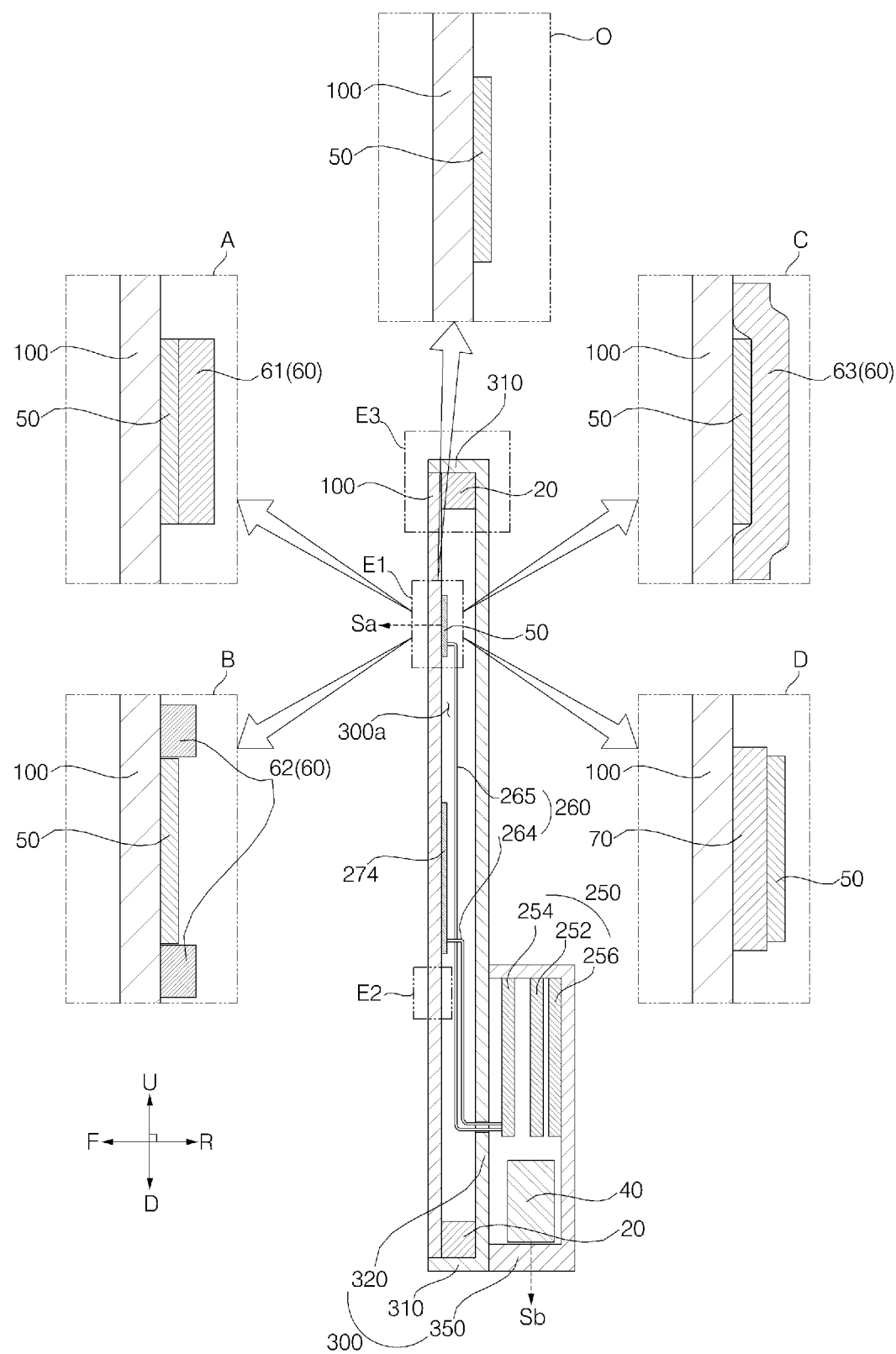
FIG. 3 is a sectional view taken along line S1-S1' of the display apparatus 1 depicted in FIGS. 1 and 2, in which enlarged sectional views of portion E1 are illustrated according to type O, type A, type B, type C and type D.
Figure 7:
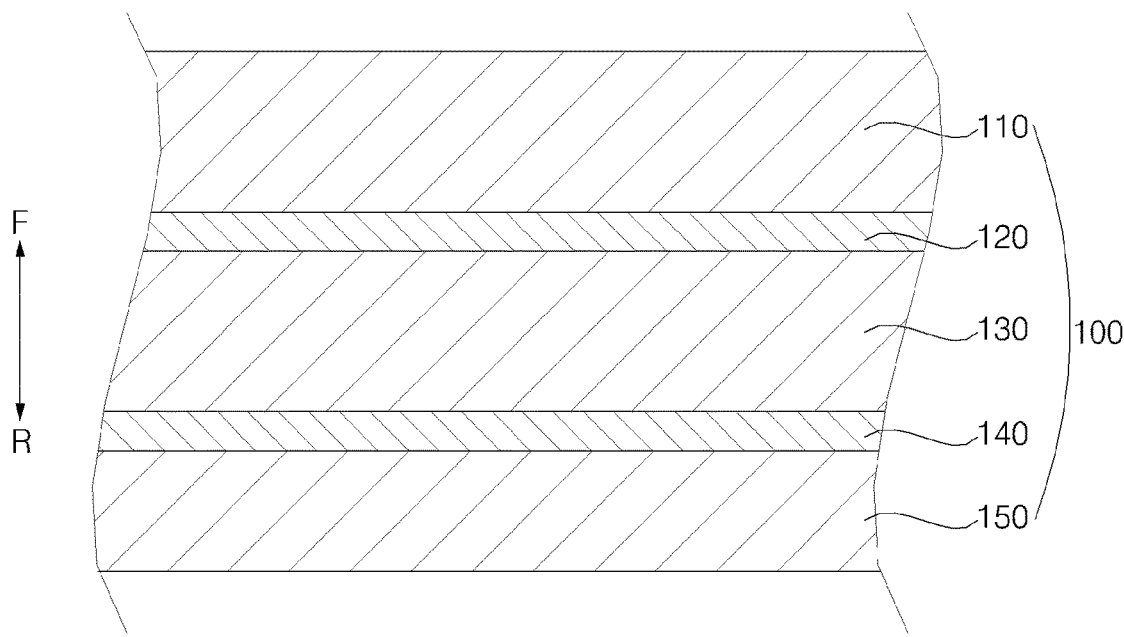
FIG. 7 is an enlarged sectional view of portion E2 depicted in FIG. 3.

Referring to FIGS. 3 and 7, the display panel 100 may be embodied as a plasma display panel (PDP), a field emission display (FED), a liquid crystal display (LCD), or an organic light-emitting diode (OLED) display. The OLED display panel is advantageous with regard to direct vibration due to its thin and flexible properties, and is also advantageous in attachment of the piezoelectric vibration unit 50 to the rear surface thereof because it does not need a backlight module.

From this point of view, it is preferable for the display panel 100 to be an OLED display panel 100; however, the invention is not limited thereto.

The embodiment of the OLED display panel 100 will now be described in detail with reference to FIG. 7. The display panel 100 may include a upper cover layer 110, an upper electrode 120, an organic light-emitting layer 130, a lower electrode 140 and a lower cover layer 150. The upper cover layer 110, the upper electrode 120, the organic light-emitting layer 130, the lower electrode 140 and the lower cover layer 150 may be sequentially disposed from the front to the rear.

The upper cover layer 110 and the upper electrode 120 may include a transparent material. The upper cover layer 110 may be formed on a glass material having a thickness of 0.7 mm. The upper cover layer 110 may be formed of a transparent thin film. The upper electrode 120 may be cathode, and the lower electrode 140 may be anode. The lower electrode 140 may include a non-transparent material; however, the embodiment is not limited thereto, but the lower electrode 140 may include a transparent material (e.g. ITO, etc.). In this case, light may be radiated to one surface of the lower electrode 140. When a voltage is applied to the upper and lower electrodes 120 and 140, the light emitted from the organic light-emitting layer 130 may pass through the upper electrode 120 and the upper cover layer 110 and may be radiated outside. OLED display panel 100 may include includes a light-shielding plate positioned in the rear surface of the lower electrode 140. A electron transfer layer (ETL) (not shown) may be disposed between the organic light-emitting layer 130 and the upper electrode 120. A hole transfer layer (ETL) (not shown) may be disposed between the organic light-emitting layer 130 and the lower electrode 140. The lower cover layer 150 may be formed of an invar material having a thickness of 0.1 mm. The lower cover layer 150 may be formed of an glass. A thin film transistor (TFT) (not shown) may be disposed between the lower electrode 140 and the lower cover layer 150.

Referring to FIG. 3, the display apparatus 1 comprises a cover 300 for supporting the marginal portion of the display panel 100. The cover 300 comprises an outer portion configured to support a marginal portion of the display panel 100. The cover 300 is spaced apart from the rear surface of the display panel 100 so as to form a space 300a between the cover 300 and the display panel 100. An inner portion of the cover 300 is spaced apart from the rear side of the display panel 100 defining a space 300a therebetween. The piezoelectric vibration unit 50 is disposed in the space 300a. The cover 300 includes a side cover 310, which extends along the periphery of the display panel 100. The cover 300 includes a back cover 320 for covering the rear surface of the display panel 100. The cover 300 includes a housing 350, which has therein a space for accommodating at least a portion of the control unit 250. The housing 350 may accommodate the sub-speaker 40.

An adhesive sheet 20 is disposed between the rear surface of the display panel 100 and the front surface of the back cover 320. The display panel 100 may be attached to the back cover 320 by means of the adhesive sheet 20. The adhesive sheet 20 may include a piece of double-sided tape, to both sides of which objects can be adhered. The rear surface of the display panel 100 is adhered to the front surface of the adhesive sheet 20. The rear surface of the adhesive sheet 20 is adhered to the front surface of the back cover 320. The display panel 100 and the back cover 320 are spaced apart from each other by the adhesive sheet 20.

The side cover 310 extends along at least one of the four sides of the display panel 100, i.e. the upper, lower, left and right sides thereof. In this embodiment, the side cover 310 is disposed to surround all four sides of the display panel 100. The side cover 310 may be disposed in contact with the periphery of the display panel 100. The side cover 310 functions to seal a gap between the periphery of the display panel 100 and the periphery of the back cover 320.

Figure 8A:
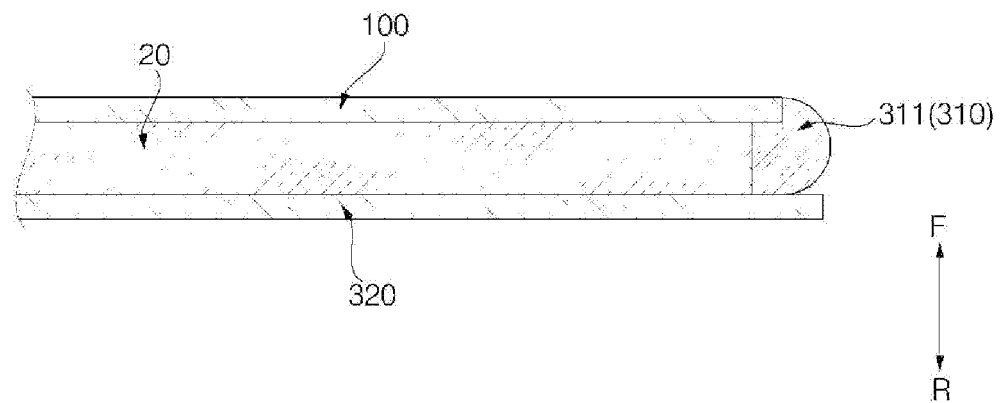
FIGS. 8a, 8b, 8c and 8d are an enlarged sectional view of portion E3 depicted in FIG. 3.

A side cover 311, according to the first embodiment illustrated in FIG. 8a, may be supported by hardening a semisolid sealing material. The side cover 311 may be attached to one surface of the adhesive sheet 20 along the periphery of the display panel 100 in a sealed manner. The sealing material is hardened in the state of being in contact with the periphery of the display panel 100, the periphery of the back cover 320 and the one surface of the adhesive sheet 20, with the result that the side cover 311 is securely supported.

Figure 8B:
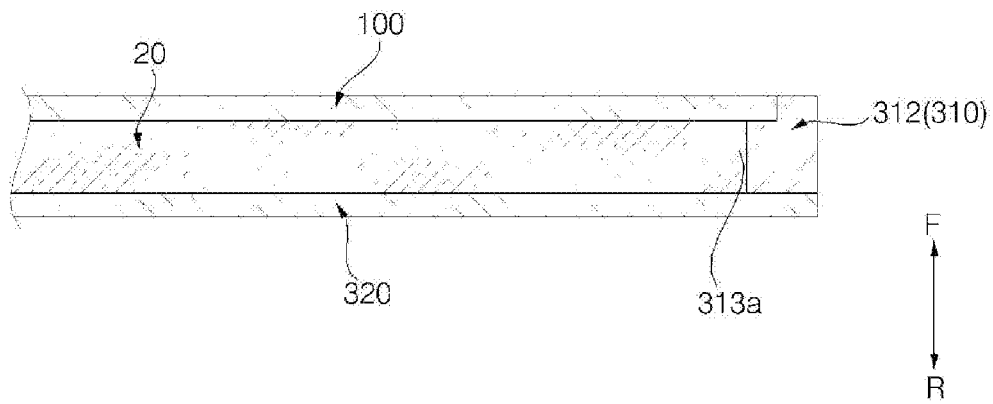

A side cover 312, according to the second embodiment illustrated in FIG. 8b, may be fixedly inserted into a gap between the rear surface of the display panel 100 and the front surface of the back cover 320. The side cover 312 is disposed in contact with one surface of the adhesive sheet 20. One end of the side cover 312 is in contact with the one surface of the adhesive sheet 20, and the other end of the side cover 312 is bent in the forward direction. The side end of the display panel 100 is shielded by the side cover 312. The side end of the display panel 100 may be in contact with the side cover 312.

Figure 8C:
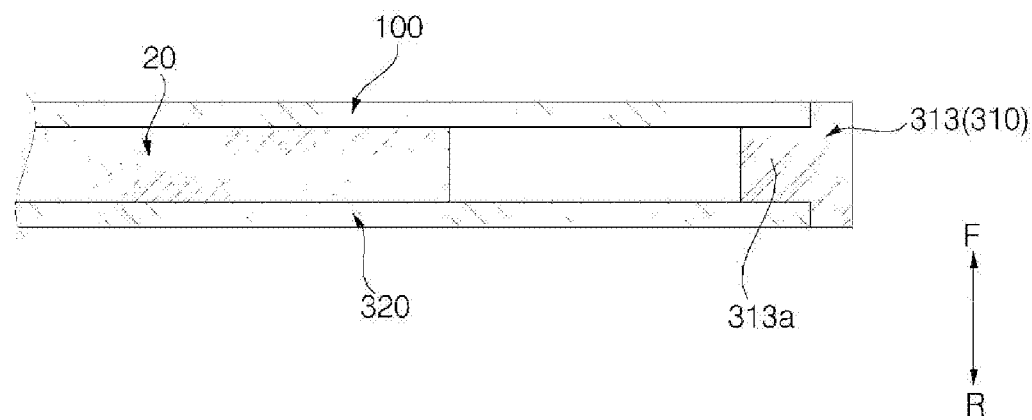

A side cover 313, according to the third embodiment illustrated in FIG. 8c, may be fixedly inserted into a gap between the rear surface of the display panel 100 and the front surface of the back cover 320. The side cover 313 is disposed so as to be spaced apart from one surface of the adhesive sheet 20. The side cover 313 includes an insertion portion 313a, which is inserted into a gap between the rear surface of the display panel 100 and the front surface of the back cover 320. A portion of the side cover 313 protrudes from the insertion portion 313a in the forward direction and shields the side end of the display panel 100. The side end of the display panel 100 may be in contact with the side cover 313. A portion of the side cover 313 protrudes from the insertion portion 313a in the backward direction and shields the side end of the back cover 320. The side end of the back cover 320 may be in contact with the side cover 313.

Figure 8D:
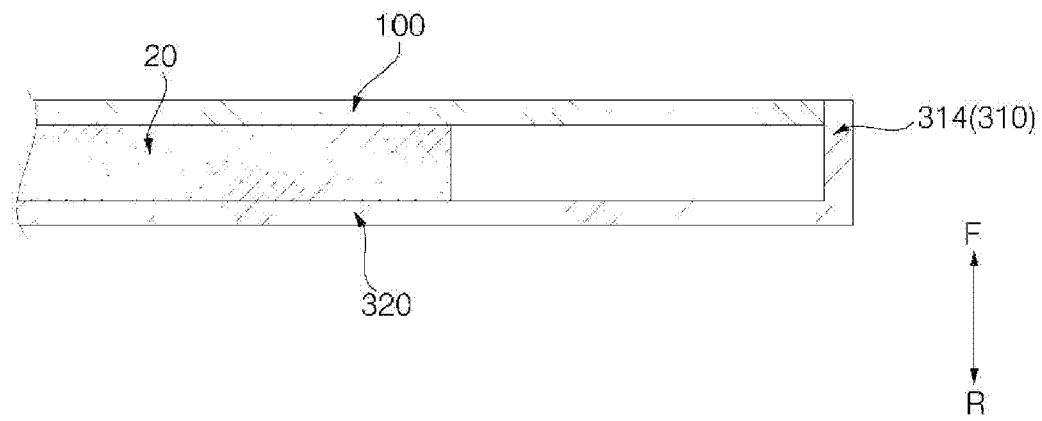

A side cover 314, according to a fourth embodiment illustrated in FIG. 8d, is integrally formed with the back cover 320. The peripheral portion of the back cover 320 is bent in the forward direction and serves as the side cover 314. That is, the side cover 314 protrudes from the back cover 320 in the forward direction. The side cover 314 shields the side end of the display panel 100. The side end of the display panel 100 may be in contact with the side cover 314.

The housing 350 accommodates the control unit 250. The control unit 250 includes a main circuit board 252 for processing various control signals. The control unit 250 includes a control board 254 for controlling image output. The main circuit board 252 or the control board 254 may control vibration output of the piezoelectric vibration unit 50, or there may be provided an additional vibration control board (not shown) for controlling vibration output of the piezoelectric vibration unit 50. The control unit 250 includes a power supply unit 256 for distributing power to the respective components of the display apparatus 1. The power supply unit 256 may supply power to the display panel 100. The power supply unit 256 may supply power to the piezoelectric vibration unit 50. The power supply unit 256 may receive and store external power.

The display apparatus 1 may comprise a cable 260 for transferring control signals from the control unit 250 to the respective components. The cable 260 includes a plurality of conductive wires. The cable 260 may be provided in a plural number. The cable 260 may be embodied as a flat cable having a flat shape, or may be embodied as a circular cable having a circular-shaped cross-section. The cable 260 may include a plurality of signal-connecting terminal pins and at least one ground terminal pin.

The cable 260 includes an image signal transfer wire 264 for transferring image output signals to the display panel 100. One end of the image signal transfer wire 264 is connected to the control board 254, and the other end of the image signal transfer wire 264 is connected to an interface PCB 274 disposed at the display panel 100.

The cable 260 includes a vibration signal transfer wire 265 for transferring a vibration output signal to the piezoelectric vibration unit 50. One end of the vibration signal transfer wire 265 is connected to the control board 254, and the other end of the vibration signal transfer wire 265 is connected to the piezoelectric vibration unit 50. Two vibration signal transfer wires 265 for the supply of voltage may be used for one piezoelectric vibration unit 50. For instance, four vibration signal transfer wires 265 are provided to control two piezoelectric vibration units 50.

In the embodiment illustrated in FIG. 3, the housing 350 may be provided so as to be coupled with the back cover 320. In this case, the housing 350 may be coupled to a lower portion of the rear surface of the back cover 320. The cable 260 is disposed in the internal space in the housing 350 and in the internal space 300a in the back cover.

In the wall-mounted display apparatus 1b' according to the embodiment illustrated in FIG. 4, the housing 350 may be provided so as to be separate from the back cover 320. The cable 260 for electrically connecting the control unit 250 in the housing 350 and the display unit 100 and 50 is exposed outside. The cable 260 may be embodied such that a plurality of conductive wires is formed into a bundle.

Figure 5A:
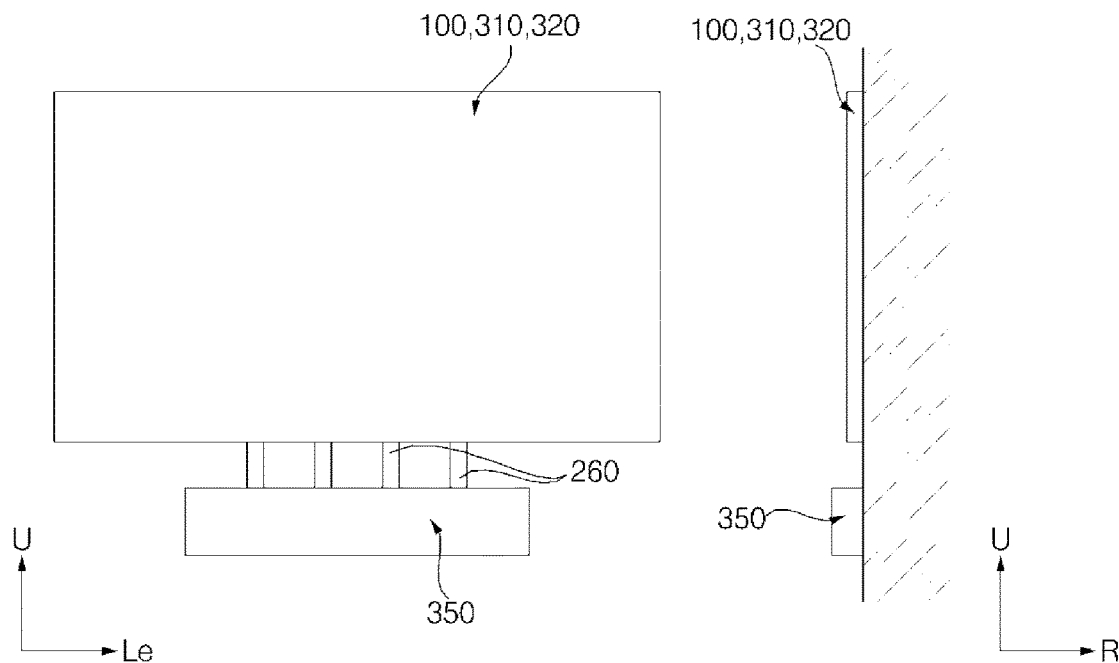
FIGS. 5a and 5b illustrate views of other modified examples of the display apparatus 1 depicted in FIG. 4.

In the wall-mounted display apparatus 1b' according to a modified embodiment illustrated in FIG. 5a, cables 260, which are divided into a plurality of bundles, are provided. As shown in FIG. 5a, four cables 260 are exposed.

Figure 5B:
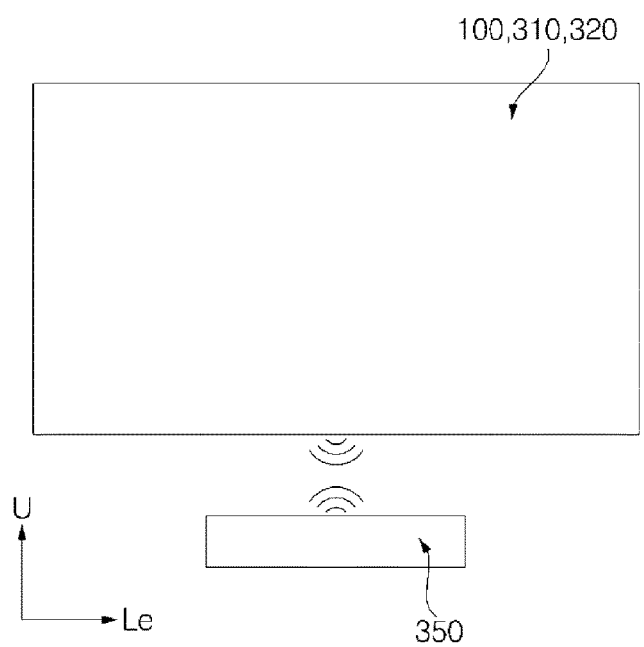

In the wall-mounted display apparatus 1b' according to another modified embodiment illustrated in FIG. 5b, the control unit 250 may be configured to transfer control signals to the display unit 100 and 50 in a wireless manner. In this case, it is possible to realize a display apparatus 1b' without a cable 260 for electrically connecting the housing 350 and the display unit 100 and 50.

Figure 6:
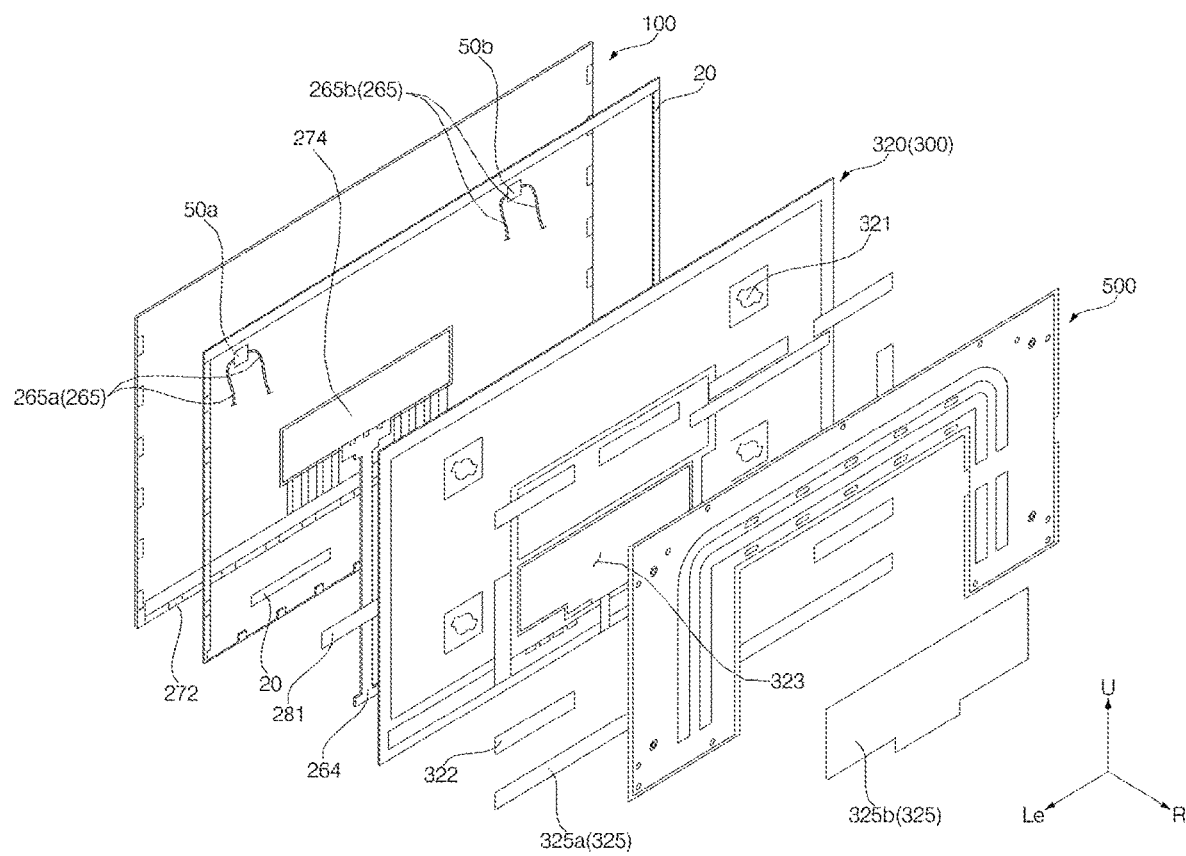
FIG. 6 is an exploded perspective view of the display apparatus 1 depicted in FIG. 4, in which illustration of a housing 350 is omitted.

The components, which are disposed in the display panel 100 and/or the cover 300, will now be described in detail with reference to FIG. 6.

An interface PCB 274 and at least one source PCB 272 may be positioned on at least a portion of the rear surface of the display panel 100. The interface PCB 274 may be positioned above the at least one source PCB 272. The at least one source PCB 272 may be electrically connected to the interface PCB 274. The at least one source PCB 272 may include a plurality of source PCBs 272. The plurality of source PCBs 272 may be spaced apart from each other.

The interface PCB 274 may include signal wiring for transferring digital video data and timing control signals transmitted from the control board 254.

The source PCB 272 may apply the voltage to the display panel 100 in response to the signals transferred from the interface PCB 274. The source PCB 272 may apply the drive waveform to the display panel 100 in response to the image signals.

The source PCB 272 may be electrically connected to the display panel 100 by a source COF (Chip on Flexible Printed Circuit) (not shown). The source COF, which is connected with a portion of the source PCB 272, may be connected to a lower end of the display panel 100. The source COF may be electrically connected to the source PCB 272 and the TFT of the display panel 100. A data integrated circuit may be mounted as the source COF.

The adhesive sheet 20 for coupling the display panel 100 and the back cover 320 is positioned on the rear surface of the display panel 100. The adhesive sheet 20 may be formed to have a quadrangular-frame shape, which forms a space surrounded thereby. At least one PCB may be positioned in the space 300a surrounded by the adhesive sheet 20. One surface of the adhesive sheet 20 may be coupled to the display panel 100, and the opposite surface of the adhesive sheet 20 may be coupled to the back cover 320.

An insulating sheet 281 may be provided at a portion corresponding to the position of the source PCB 272. The insulating sheet 281 may be attached to the front surface of the back cover 320. The insulating sheet 281 may include an insulating material for preventing the source PCB 272 from being influenced by other electronic devices.

The back cover 320 is disposed behind the display panel 100. The back cover 320 may be attached to the display panel 100 by means of the adhesive sheet 20. The back cover 320 may function to support the rear surface of the display panel 100. The back cover 320 may include an aluminum material.

The thickness of the marginal portion of the back cover 320 in the front-rear direction may be thicker than the thickness of the remaining portion of the back cover 320 in the front-rear direction. The marginal portion of the back cover 320 may protrude backwards. When the back cover 320 is coupled to a wall bracket 500, the protruding marginal portion of the back cover 320 covers the marginal portion of the wall bracket 500. The wall bracket 500 is a member that is secured to a wall in order to support the display apparatus 1.

The back cover 320 has coupling holes 321 formed at positions near the four corners thereof. The coupling holes 321 may be formed through the back cover 320. The coupling holes 321 may be formed in the rear surface of the back cover 320. The portion of the back cover 320, in which each of the coupling holes 321 is located, may be formed so as to protrude further backwards than the remaining portion. The coupling holes 321 function to detachably couple the wall bracket 500 and the cover 300.

The back cover 320 includes coupling portions 322 disposed in the marginal portion thereof. The coupling portions 322 may be disposed along at least one of the four sides of the back cover 320. The coupling portions 322 may be formed so as to protrude from the back cover 320 in the backward direction. The rear surface of the portion of the back cover 320 in which the coupling portions 322 are disposed and the rear surface of the portion of the back cover 320 in which the coupling holes 321 are formed may lie in the substantially same plane. The coupling portions 322 may include a material having magnetic properties. When the cover 300 is coupled to the wall bracket 500, the coupling force becomes stronger due to the magnetic properties of the coupling portions 322.

The back cover 320 has an opening 323 formed in a portion that corresponds to the position of the interface PCB when the display panel 100 and the cover 300 are coupled to each other. The opening 323 is located in the middle of the back cover 320. The opening 323 is disposed behind the interface PCB 274. The thickness of the interface PCB 274 in the front-rear direction may be thicker than the thickness of the space 300a between the back cover 320 and the display panel 100 in the front-rear direction, and the opening 323 provides a space in which the interface PCB 274 is located.

There are further provided PCB covers 325, which are disposed behind the PCBs 272 and 274 secured to the rear surface of the display panel 100. The PCB covers 325 may be coupled to the back cover 320. The PCB covers 325 may include a first PCB cover 325a and a second PCB cover 325b. The first PCB cover 325a is located at a portion corresponding to the position of the source PCB 272. The second PCB cover 325b is located at a portion corresponding to the position of the interface PCB 274. The second PCB cover 325b may cover the opening 323. The PCB covers 325 may prevent the source PCB 272 and the interface PCB 274 from being exposed outside.

The arrangement position and the sound image SI of the piezoelectric vibration unit 50 will now be described with reference to FIG. 2. The display panel 100 may be formed such that a width thereof in the lateral direction is longer than a height thereof in the vertical direction. The display apparatus 1 may include at least two piezoelectric vibration units 50a and 50b, which are arranged so as to be spaced apart from each other. a first piezoelectric vibration unit 50a and a second piezoelectric vibration unit 50b are spaced apart from each other. The first piezoelectric vibration unit 50a may be positioned in an upper left quadrant of the display panel 100 and the second piezoelectric vibration unit 50b may be positioned in an upper right quadrant of the display panel 100. The first piezoelectric vibration unit 50a may be positioned in a middle region of the upper left quadrant of the display panel 100 and the second piezoelectric vibration unit 50b may be positioned in a middle region of the upper right quadrant of the display panel 100. On the assumption that the entire region of the display panel 100 is equally divided into six columns (six imaginary sections divided by V1, V2, V3, V4, V5, V6 and V7), one 50a of the two piezoelectric vibration units 50a and 50b is located in the second column from the left, and the other one 50b is located in the second column from the right. Further, on the assumption that the entire region of the display panel 100 is equally divided into six rows (six imaginary sections divided by H1, H2, H3, H4, H5, H6 and H7), the two piezoelectric vibration units 50a and 50b are located in the second row from the top. As a result, the sound image SI generated by the two piezoelectric vibration units 50a and 50b may be located at the center portion of the display panel 100.

The separation distance between two random piezoelectric vibration units 50a and 50b from among the plurality of piezoelectric vibration units 50 is set to such a value that destructive interference between the predetermined ranges of low frequencies generated by the two piezoelectric vibration units 50a and 50b is avoided. To this end, the separation distance d between the two piezoelectric vibration units 50a and 50b may be set to be greater than 0 and less than a first predetermined distance d1 that is derived from following equation 1, or may be set to be greater than a second predetermined distance d2 that is derived from following equation 2 and less than the diagonal length of the front surface of the display panel 100.

$$d1 = (4 \times c)/f2 \qquad \text{[Equation 1]}$$

$$d2 = (4 \times c)/f1 \qquad \text{[Equation 2]}$$

Here, c refers to the speed of sound, f1 refers to the minimum boundary value of the predetermined low frequency range, and f2 refers to the maximum boundary value of the predetermined low frequency range. Although the speed of sound c varies depending on the temperature, the first predetermined distance d1 and the second predetermined distance d2 may be set on the assumption that the speed of sound is 340 m/s, which is a value at room temperature. The predetermined low frequency range may be regarded as being from 100 Hz to 800 Hz, which is equivalent to the frequency range of the human voice, and, in this case, f1 is set to 100 Hz and f2 is set to 800 Hz.

Hereinafter, various constructions of the piezoelectric vibration unit 50, the member 60 and the damping member 70 and experimental results of the respective constructions will be described in detail. Further, experimental data for verifying the effects of the respective constructions will be provided.

FIG. 3 illustrates enlarged sectional views of various modifications (type O, type A, type B, type C and type D) of portion E1. The piezoelectric vibration unit 50 is disposed behind the display panel 100. Type O refers to a reference construction in which the member 60 and the damping member 70 are not provided and only the piezoelectric vibration unit 50 is attached to the rear surface of the display panel 100. That is, type O is a reference with which the effects of the member 60 or the damping member 70 are compared. Type A refers to an experimental group in which a member 61 is attached only to the rear surface of the piezoelectric vibration unit 50. Type B refers to an experimental group in which a member 62 is attached only to a portion of the rear surface of the display panel 100 that surrounds the piezoelectric vibration unit 50. Type C refers to an experimental group in which a member 63 is attached to both the rear surface of the piezoelectric vibration unit 50 and a portion of the rear surface of the display panel 100 that surrounds the piezoelectric vibration unit 50. Type D refers to an experimental group in which the damping member 70 is attached to the rear surface of the display panel and the piezoelectric vibration unit 50 is attached to the rear surface of the damping member 70.

FIGS. 9a to 9e, 10a to 10c, 11, 12a to 12f, 14a to 14f, 16a and 16b illustrate log-scale graphs showing experimental examples of measuring the magnitudes (dB) of the outputs according to the respective frequency ranges (Hz) generated when predetermined voltages are applied to the piezoelectric vibration unit 50. In the respective drawings, the graph associated with type O is illustrated together with the graph associated with the experimental example of type A, type B, type C or type D. Each graph has an X-Y coordinate system, in which the X-axis represents a magnitude (Hz) of the frequency and the Y-axis represents a magnitude (dB) of the vibration output. A rear elevation view of the portion at which the piezoelectric vibration unit 50 is disposed is illustrated near the right upper corner of each graph, and the graph represents the experimental result of the experimental group having the construction illustrated in the elevation view. An auxiliary box for discrimination between the graph line of type O and the graph line of the experimental group is illustrated near the right lower corner of each graph. The value (g) of the weight W of the member 60 or the value (mm) of the thickness T of the damping member 70 in the front-rear direction in the experimental group is described in the auxiliary box.

The piezoelectric vibration unit 50 used for the experiments proposed in this disclosure is formed by stacking sixteen layers of a PZT material so that electricity flows the stacked layers in a zigzag manner. The piezoelectric vibration unit 50 used for the experiments proposed in this disclosure is formed in a quadrangular shape having a size of about 40 mm×about 30 mm when seen from behind and a thickness of about 0.8 mm in the front-rear direction. The display panel used for the experiments is a 65-inch OLED display panel. The member 60 and the damping member 70 used for the experiments are formed in a pad type.

The piezoelectric vibration unit 50 is attached to the rear surface of the display panel 100. The piezoelectric vibration unit 50 comprises a first side coupled to the rear side of the display panel 100. The vibration generated by the piezoelectric vibration unit 50 is transferred to the display panel 100, and consequently the display panel 100 vibrates. As a result of the direct vibration of the display panel 100, a sound can be output. In the embodiment (type A, type B or type C), in which the piezoelectric vibration unit 50 is attached to the display panel 100, the vibration generated by the piezoelectric vibration unit 50 is directly transferred to the display panel 100. In the embodiment (type D), in which the damping member 70 is provided, the vibration generated by the piezoelectric vibration unit 50 is transferred to the display panel 100 via the damping member 70.

A first side of the member 60 is attached to at least the piezoelectric vibration unit or the portion of the rear side of the display panel 100, and a second side of the member opposite the first side of the member does not contact any other portion of the display apparatus 1. The vibration of the member 60 is not interfered by the contacts of the any other portion of the display apparatus 1 except for the contact of the piezoelectric vibration unit 50 and/or the display panel 100. The member 60 may comprise multiple weight members. The vibration of one of the weight members is not interfered by the contacts of the any other portion of the display apparatus 1 except for the contact of the piezoelectric vibration unit 50, the display panel 100 and/or other one of the weight members. The gravity load of the piezoelectric vibration unit 50 is fully transferred to the rear surface of the display panel 100. In the embodiment (type A, type B or type C), in which the piezoelectric vibration unit 50 is attached to the display panel 100, the gravity load of the piezoelectric vibration unit 50 is directly transferred to the display panel 100. In the embodiment (type D), in which the damping member 70 is provided, the gravity load of the piezoelectric vibration unit 50 is transferred to the display panel 100 via the damping member 70. That is, the vibration generated by the piezoelectric vibration unit 50 is transferred to the display panel 100 without interference with components other than the member 60 or the damping member 70, thereby obtaining desired predetermined effects.

The piezoelectric vibration unit 50 may be formed so as to achieve the piezoelectric effect using a ceramic material. The piezoelectric vibration unit 50 may use other well-known materials capable of achieving the piezoelectric effect. Preferably, the piezoelectric vibration unit 50 may include a PZT material so as to further remarkably increase the magnitude of the vibration output in the low frequency range using the member 60.

The member 60 is attached to at least a second side of the piezoelectric vibration unit 50 opposite the first side of the piezoelectric vibration unit 50 or a portion of the rear side of the display panel 100 surrounding the piezoelectric vibration unit 50. The member 60 is attached to either the rear surface of the piezoelectric vibration unit 50 (hereinafter, referred to as an "A region") or the portion of the rear surface of the display panel 100 that surrounds the piezoelectric vibration unit 50 (hereinafter, referred to as a "B region") (type A or type B), or is attached to both the A region and the B region (type C). The average magnitude of the vibration output in the low frequency range in the case in which the piezoelectric vibration unit 50 vibrates when the member 60 is present (type A, type B or type C) is greater than the average magnitude of the vibration output in the low frequency range in the case in which the piezoelectric vibration unit 50 vibrates when the member 60 is absent (type O).

As can be seen from the experimental examples illustrated in FIGS. 9*a* to 9*e*, 10*a* to 10*c* and 11, the average magnitude of the vibration output in the low frequency range in type A, type B or type C becomes greater than in type O. Here, the low frequency range used for the experiments may be defined as being a range from 100 Hz to 800 Hz. The frequency range from 100 Hz to 800 Hz is meaningful since it is a frequency range in which a sound image SI is perceived while it is a frequency range in which the vibration output is relatively low in comparison with other frequencies below 16,000 Hz in type O. Since the wavelength is lengthened in the range of frequencies that are lower than 100 Hz (the frequency range from greater than 0 Hz to less than 100 Hz), it is difficult for the user to perceive the generation position of the sound output (the sound image SI). Therefore, it is important to locate a sound source (the generation position of the sound) in a low frequency range of greater than or equal to 100 Hz at the front surface of the display panel 100, whereas it is less important to locate a sound source in the frequency range of less than 100 Hz at the front surface of the display panel 100. Further, since the frequency of the human voice is generally greater than or equal to 100 Hz, it is further important to increase the vibration output in the low frequency range of greater than or equal to 100 Hz in order to prevent a disconnect between the image and the sound. In addition, a sub-speaker 40 (e.g. a woofer) may be provided to output sound having frequencies of less than or equal to 100 Hz.

Further, the high frequency range used for the experiments may be defined as being a range from 2,000 Hz to 16,000 Hz.

The member 60 may be formed to have a quadrangular shape, a circular shape or an elliptical shape when seen from behind. The member 60 may be formed in a pad type, which has a substantially constant thickness in the front-rear direction.

It is preferable for the member 60 to be formed to have a vertically symmetrical structure with respect to the center of gravity of the piezoelectric vibration unit 50. It is preferable for the member 60 to be formed to have a bilaterally symmetrical structure with respect to the center of gravity of the piezoelectric vibration unit 50. The member 60 may be symmetrical with respect to a center of gravity of the piezoelectric vibration unit 50. It is preferable for the center of gravity of the member 60 to be aligned with the center of gravity of the piezoelectric vibration unit 50 when seen from behind. As a result, the interference effect of the member 60 with respect to the vibration output of the piezoelectric vibration unit 50 (e.g. the effect of increasing the magnitude of the vibration output in the low frequency range) may be obtained as desired, and this interference effect may be evenly distributed over the entire area of the piezoelectric vibration unit 50.

FIGS. 9*a* to 9*e* illustrate the experimental results according to the attachment patterns of the member 61 having a weight W of 20 g in type A. The experimental example illustrated in FIG. 9*a* includes a member 61*a*, which is attached to the entire area of the A region. The experimental example illustrated in FIG. 9*b* includes a member 61*b*, which is attached only to three portions of the four marginal portions (i.e. the four sides of the quadrangular shape) of the A region. The experimental example illustrated in FIG. 9*c* includes a member 61*c*, which is attached only to two opposite portions of the four marginal portions of the A region. The experimental example illustrated in FIG. 9*d* includes a member 61*d*, which is attached only to two adjacent portions of the four marginal portions of the A region. The experimental example illustrated in FIG. 9*e* includes a member 61*e*, which is attached only to one portion of the four marginal portions of the A region.

Figure 10A:
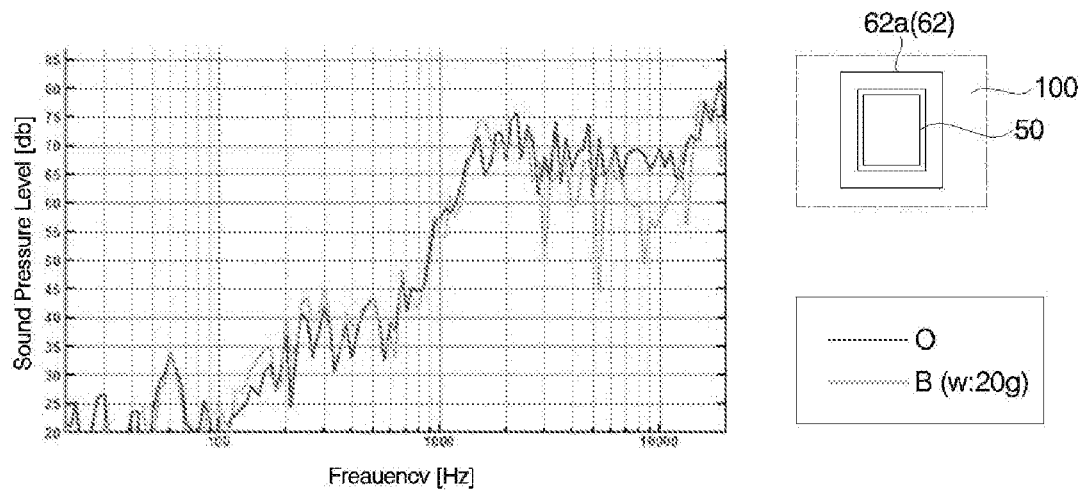
Figure 10B:
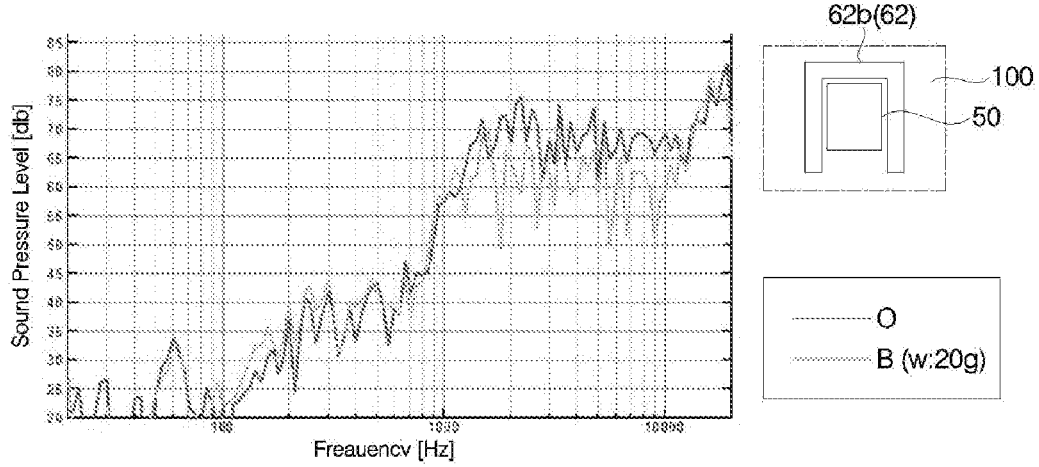
Figure 10C:
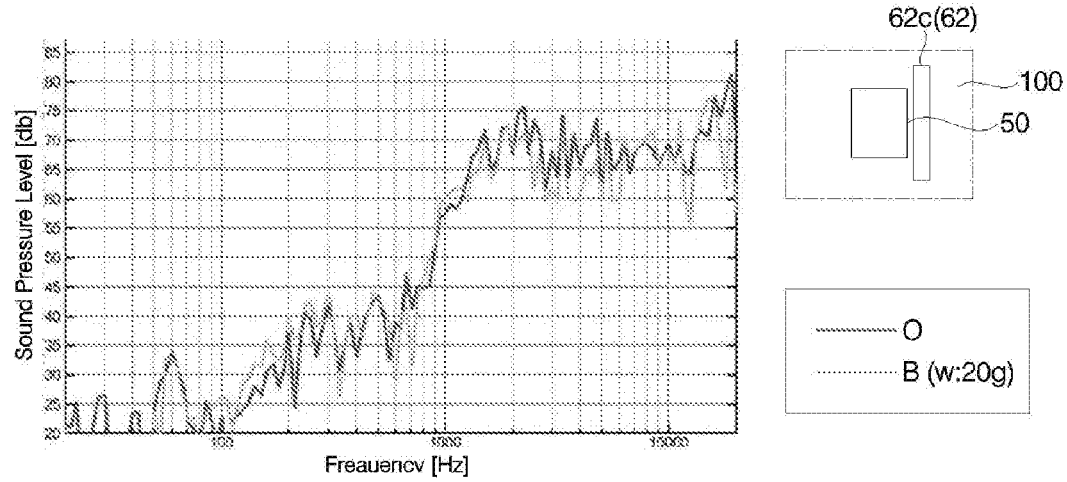

FIGS. 10*a* to 10*c* illustrate the experimental results according to the attachment patterns of the member 62 having a weight W of 20 g in type B. The experimental example illustrated in FIG. 10*a* includes a member 62*a*, which is attached to the entire area of the B region so as to surround the upper, lower, left and right sides of the piezoelectric vibration unit 50. The experimental example illustrated in FIG. 10*b* includes a member 62*b*, which is attached only to three portions of the four marginal portions (i.e. the four sides of the quadrangular shape) of the B region. The experimental example illustrated in FIG. 10*c* includes a member 62*c*, which is attached only to one portion of the four marginal portions of the B region.

Figure 11:
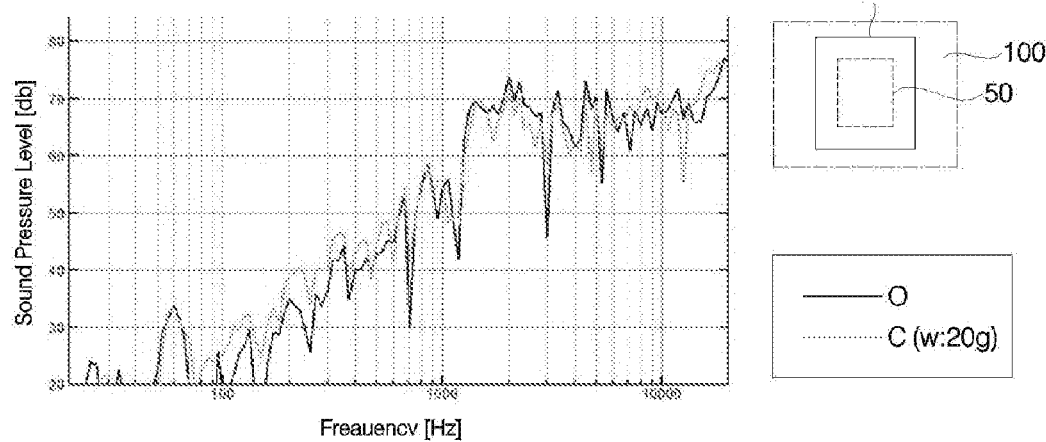
Figure 12A:
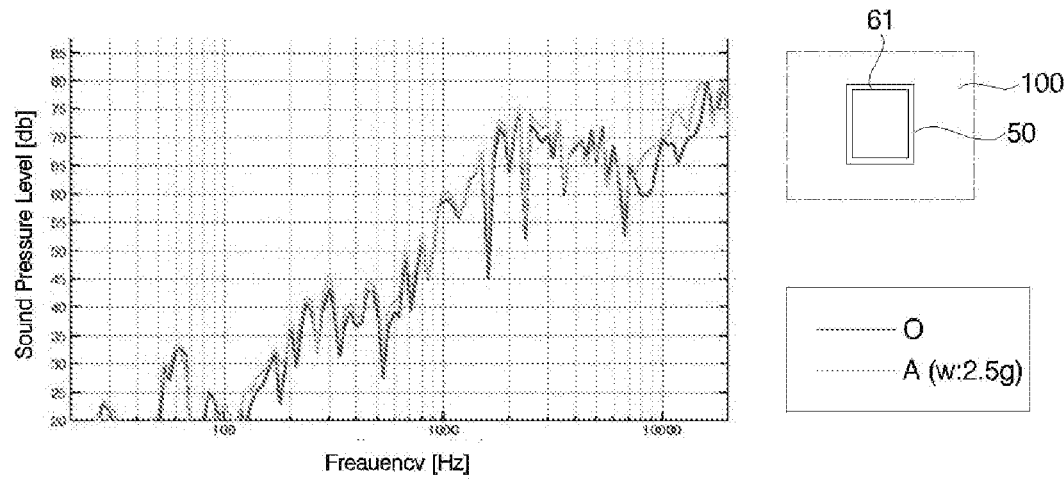
Figure 12B:
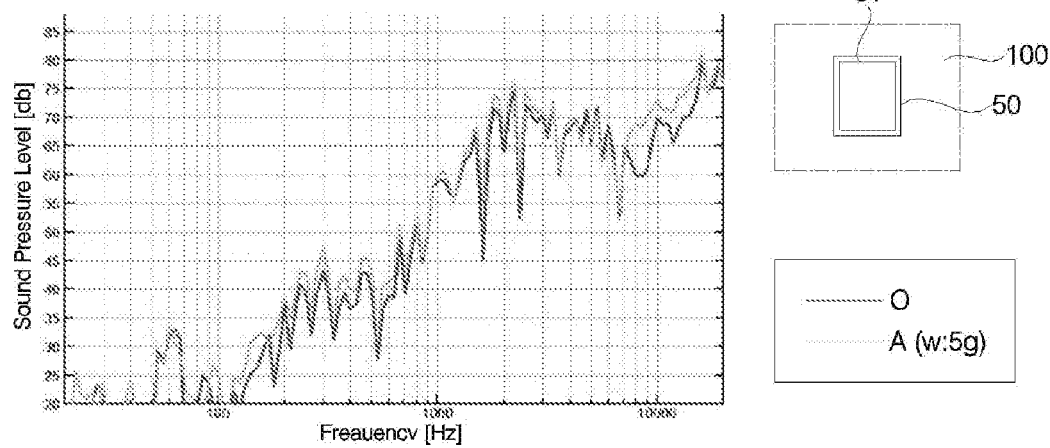
Figure 12C:
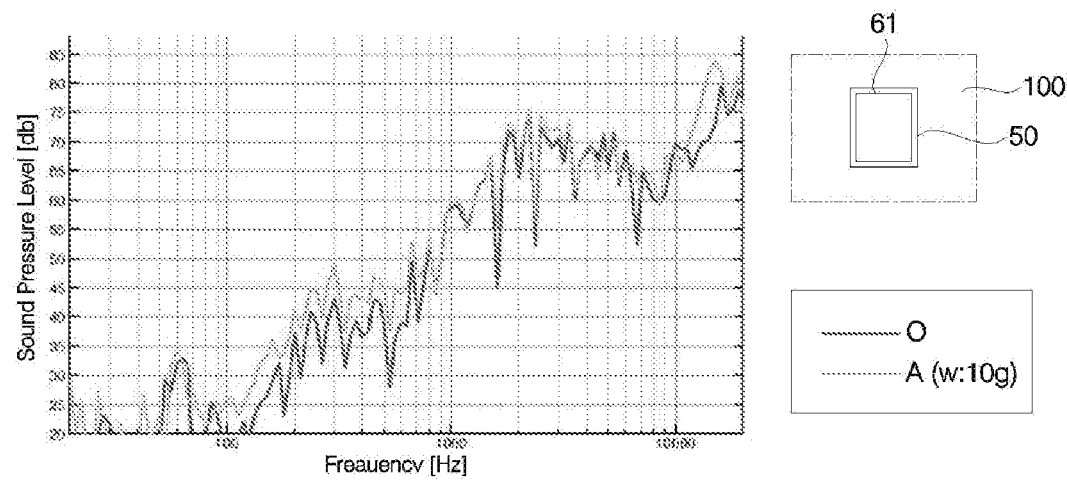
Figure 12D:
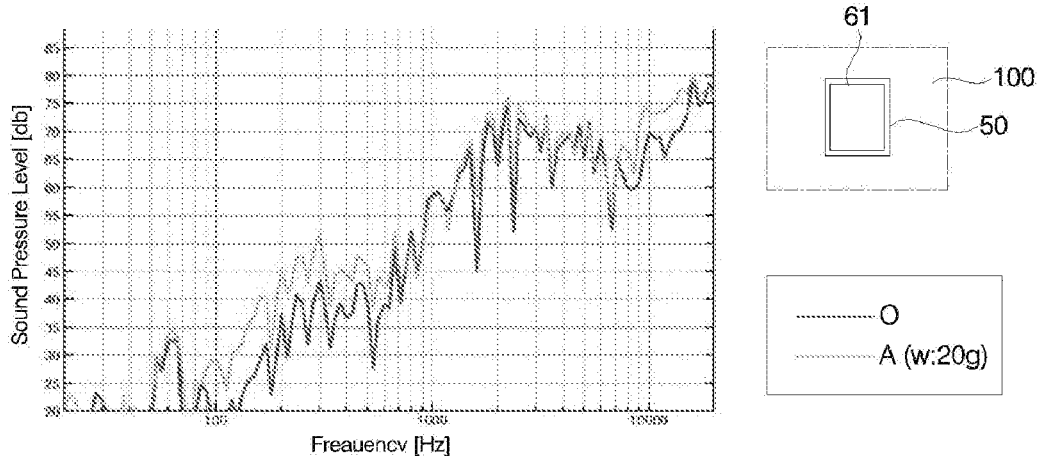
Figure 12E:
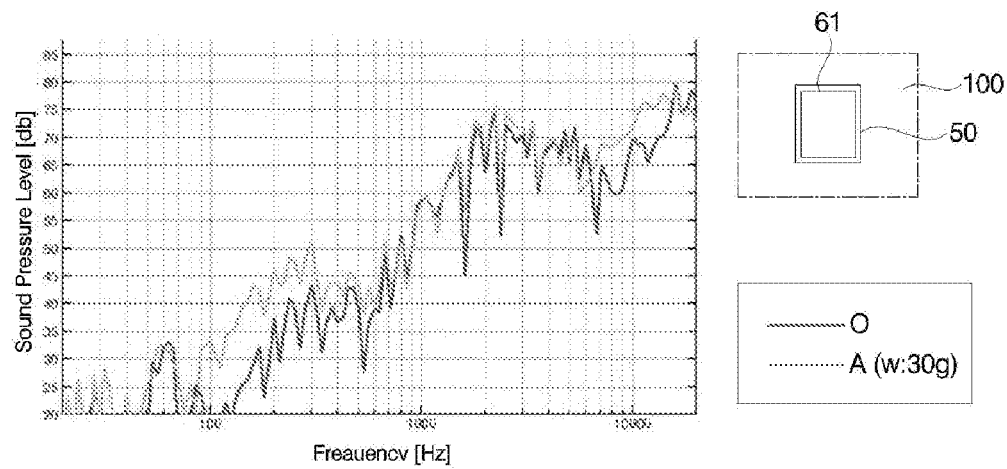
Figure 12F:
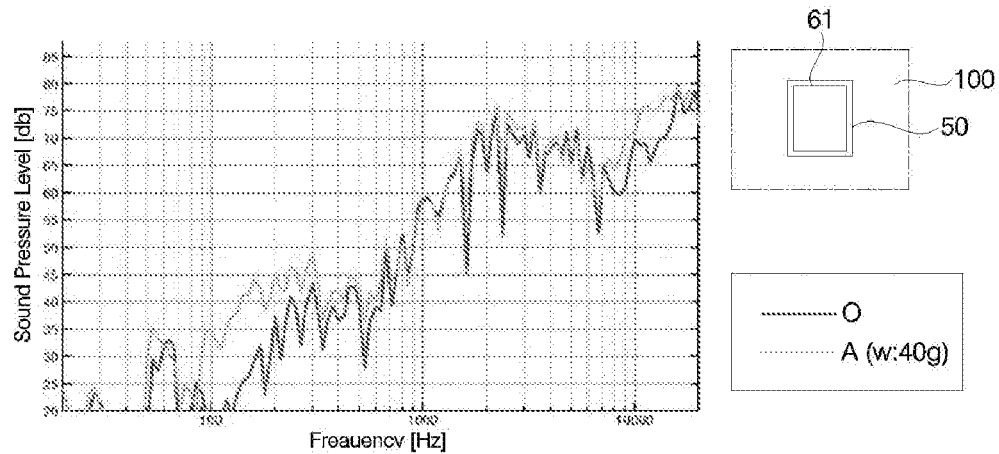

FIG. 11 illustrates the experimental result according to the attachment pattern of the member 63 having a weight W of 20 g in type C. The experimental example illustrated in FIG. 11 includes a member 63, which is attached to both the A region and the B region.

As can be seen from the above experimental results, it is preferable for the member 60 to be attached to either the A region or the B region or to be attached to both of them. As can be seen from the experimental results illustrated in FIGS. 9*a* to 9*e*, 10*a* to 10*c* and 11, even if the member 60 according to any one of type A, type B and type C is employed, there is an advantageous effect of increasing the vibration output in the low frequency range of the piezoelectric vibration unit 50. Further, even if the member 60 according to any one of the above attachment patterns is employed, there is an advantageous effect of increasing the vibration output in the low frequency range of the piezoelectric vibration unit 50.

As can be seen from the experimental results illustrated in FIGS. 9*a* to 9*e*, 10*a* to 10*c* and 11, the effect of increasing the vibration output in the low frequency range is more remarkable in type A and type C (refer to FIGS. 9*a* to 9*e* and 11) than in type B (refer to FIGS. 10*a* to 10*c*). In order to increase the vibration output in the low frequency range, it is preferable for the member 60 to be attached to the second side of the piezoelectric vibration unit 50 (type A or type C). The member 60 may be attached to the rear surface of the piezoelectric vibration unit 50.

As can be seen from the experimental results illustrated in FIGS. 9*a* to 9*e*, 10*a* to 10*c* and 11, the effect of increasing the vibration output in the high frequency range as well as the vibration output in the low frequency range is more remarkable in type A (refer to FIGS. 9*a* to 9*e*) than in type B and type C (refer to FIGS. 10*a* to 10*c* and 11). In order to increase the vibration output in the high frequency range or to at least minimize the reduction of the vibration output in the high frequency range as well as to increase the vibration output in the low frequency range, it is preferable for the member 60 to be attached only to the second side of the piezoelectric vibration unit 50 (type A). The member 60 may be attached only to the second side of the piezoelectric vibration unit 50.

Figure 9A:
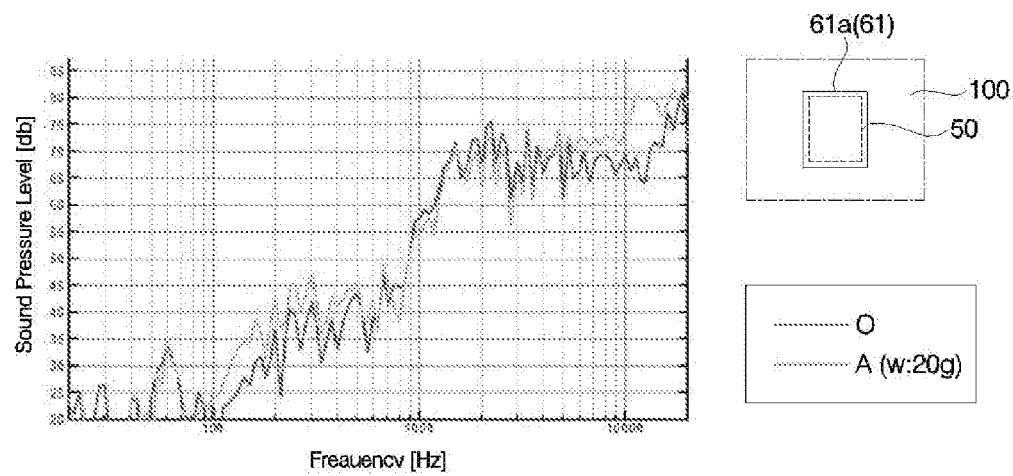
FIGS. 9a, 9b, 9c, 9d, 9e, 10a, 10b, 10c, 11, 12a, 12b, 12c, 12d, 12e, 12f, 14a, 14b, 14c, 14d, 14e, 14f, 16a and 16b illustrate log-scale graphs showing experimental examples of measuring magnitudes (dB) of outputs according to respective frequency ranges (Hz) generated when predetermined voltages are applied to a piezoelectric vibration unit 50, each illustrating a reference graph (type O) in which a member 60 or a damping member 70 is absent, a type (one of type A, type B, type C and type D), an arrangement position (a rear plan view), and an experimental graph of the type according to a weight W or a thickness T, in which the member 60 or the damping member 70 is present.
Figure 9B:
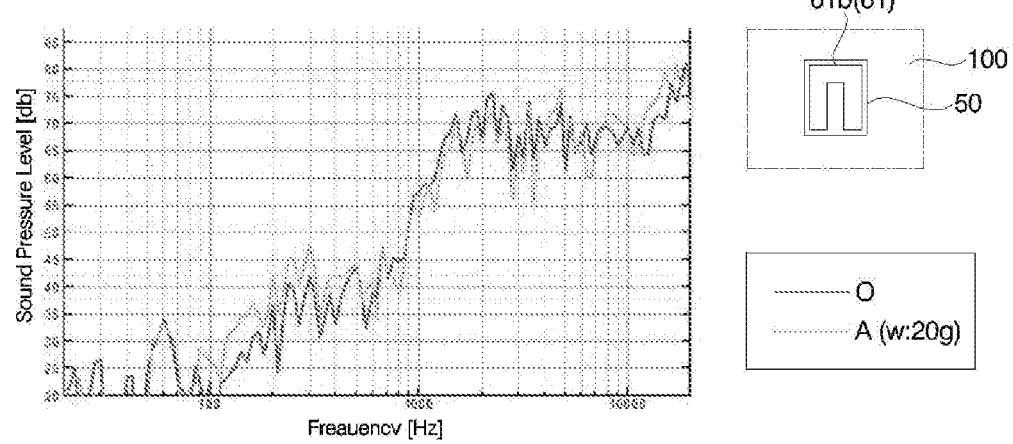
Figure 9C:
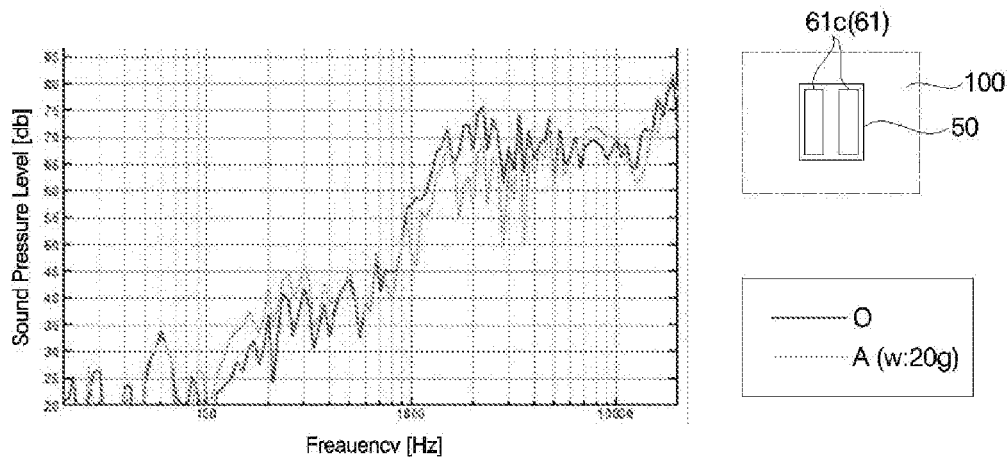
Figure 9D:
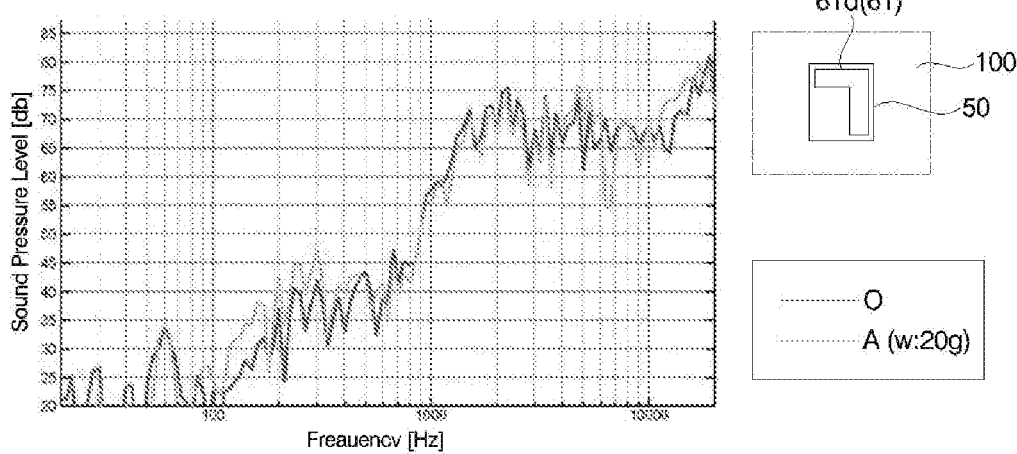
Figure 9E:
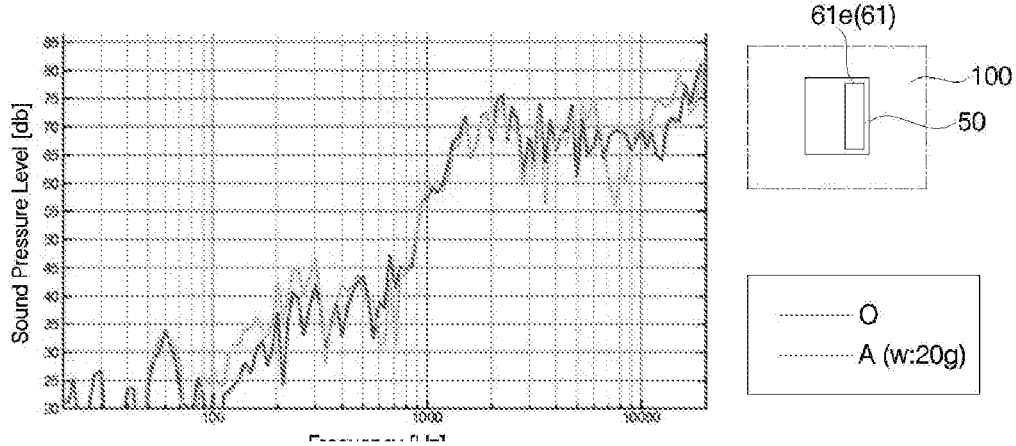

Further, as can be seen from the experimental results illustrated in FIGS. 9a to 9e, the effect of increasing the vibration output in the high frequency range as well as the vibration output in the low frequency range is more remarkable in type A, specifically, in the construction in which the member 60 is attached to the center portion of the piezoelectric vibration unit 50 (refer to FIG. 9a). In order to increase the vibration output in the high frequency range as well as the vibration output in the low frequency range, it is more preferable for the member 60 to be attached to the center portion of the piezoelectric vibration unit 50. Further, it is more preferable for the member 60 to be attached to the entire area of the rear surface of the piezoelectric vibration unit 50. The member 60 may cover an entire area of the second side of the piezoelectric vibration unit 50.

Meanwhile, referring to FIG. 3, compared to the member 61 or 63 according to type A or type C, the member 62 according to type B has an effect of decreasing the width of the space 300a in the front-rear direction. Even if type A or type C includes a member having the same weight W as the member in type B, the rear end of the member 60 protrudes at least 0.8 mm further backwards as a result of the member 60 being attached to the piezoelectric vibration unit 50. Further, since the area of the B region to which the member is attached is larger than the area of the A region, when type A or type C includes a member having the same weight W as the member in type B, the thickness of the member 60 in the front-rear direction in type B becomes thinner than in type A or type C. Therefore, it is possible to realize a thinner display apparatus 1 by decreasing the width of the space 300a in the front-rear direction. In order to minimize the thickness of the display apparatus 1 in the front-rear direction as well as to increase the vibration output in the low frequency range, it is preferable for the member 60 to be attached only to the portion of the rear surface of the display panel that surrounds the piezoelectric vibration unit 50 (the B region) (type B). The member may not be attached to the second side of the piezoelectric vibration unit 50 (type B).

The portion of the rear surface of the display panel, to which the member 62 in type B is attached, is a portion between the marginal portion of the display panel 100 and the portion to which the piezoelectric vibration unit 50 is attached.

The member 62 in type B, which is disposed around the piezoelectric vibration unit 50, may be in contact with at least a portion of the upper, lower, left and right sides of the piezoelectric vibration unit 50, or may be spaced a predetermined distance apart from the upper, lower, left and right sides of the piezoelectric vibration unit 50. In the case in which the member 62 is disposed so as to be spaced apart from the periphery of the piezoelectric vibration unit 50, no other components of the display panel 100 are disposed between the member 62 and the piezoelectric vibration unit 50.

In the case in which the member 62 is disposed so as to be spaced a predetermined distance 11 apart from the left and right sides of the piezoelectric vibration unit 50, the predetermined distance 11 may be shorter than the length of the piezoelectric vibration unit 50 in the lateral direction. In the case in which the member 62 is disposed so as to be spaced a predetermined distance 12 apart from the upper and lower sides of the piezoelectric vibration unit 50, the predetermined distance 12 may be shorter than the length of the piezoelectric vibration unit 50 in the vertical direction.

Further, referring to FIGS. 10a to 10c, the effect of increasing the vibration output in the low frequency range becomes more remarkable in type B, specifically, when the portion of the member 60 that surrounds the periphery of the piezoelectric vibration unit 50 becomes longer. Described in detail, the effect of increasing the vibration output in the low frequency range is further improved when the member 62a and 62b is attached to two or more portions of the four marginal portions of the B region (refer to FIGS. 10a and 10b) than when the member 62c is attached only to one portion of the four marginal portions of the B region (refer to FIG. 10c). In order to increase the vibration output in the low frequency range while decreasing the thickness of the display apparatus 1 in the front-rear direction, it is preferable for the member 60 to be laterally positioned adjacent to at least two sides of the piezoelectric vibration unit 50. The member 60 may surround at least two sides selected from among the upper, lower, left and right sides of the piezoelectric vibration unit 50. Further, it is preferable for the member 60 to be laterally positioned adjacent to at least two opposite sides of the piezoelectric vibration unit 50. The member 60 may surround at least two opposite sides selected from among the upper, lower, left and right sides of the piezoelectric vibration unit 50.

Further, referring to FIGS. 10a to 10c, the effects of minimizing the reduction of the vibration output in the high frequency range as well as of increasing the vibration output in the low frequency range become more remarkable in type B, specifically, when the member 60 surrounds the entire periphery of the piezoelectric vibration unit 50. Described in detail, the effects of increasing the vibration output in the low frequency range and of minimizing the reduction of the vibration output in the high frequency range are further improved when the member 62a is attached to all of the four marginal portions of the B region (refer to FIG. 10a) than when the member 62b and 62c is attached only to some of the four marginal portions of the B region (refer to FIGS. 10b and 10c). In order to increase the vibration output in the low frequency range and to minimize the reduction of the vibration output in the high frequency range while decreasing the thickness of the display apparatus 1 in the front-rear direction, it is preferable for the member 60 to be laterally positioned adjacent to all sides of the piezoelectric vibration unit 50. The member 60 may surround all of the upper, lower, left and right sides of the piezoelectric vibration unit 50.

Hereinafter, the experimental results according to the weight W of the member 61 in type A will be explained with reference to FIGS. 12a to 12f. The experimental example illustrated in FIG. 12a includes a member 61 having a weight W of 2.5 g. The experimental example illustrated in FIG. 12b includes a member 61 having a weight W of 5 g. The experimental example illustrated in FIG. 12c includes a member 61 having a weight W of 10 g. The experimental example illustrated in FIG. 12d includes a member 61 having a weight W of 20 g. The experimental example illustrated in FIG. 12e includes a member 61 having a weight W of 30 g. The experimental example illustrated in FIG. 12f includes a member 61 having a weight W of 40 g.

The experimental results illustrated in FIGS. 12a to 12f and 13 are shown in the following Table 1.

TABLE 1

|  | W (g) | | | | | | |
| --- | --- | --- | --- | --- | --- | --- | --- |
|  | 0.0 | 2.5 | 5.0 | 10.0 | 20.0 | 30.0 | 40.0 |
| L (dB) | 0.0 | 2.3 | 3.3 | 5.8 | 7.4 | 8.2 | 7.9 |
| H (dB) | 0.0 | 1.9 | 2.3 | 2.2 | 2.8 | 3.0 | 2.7 |

Figure 13:
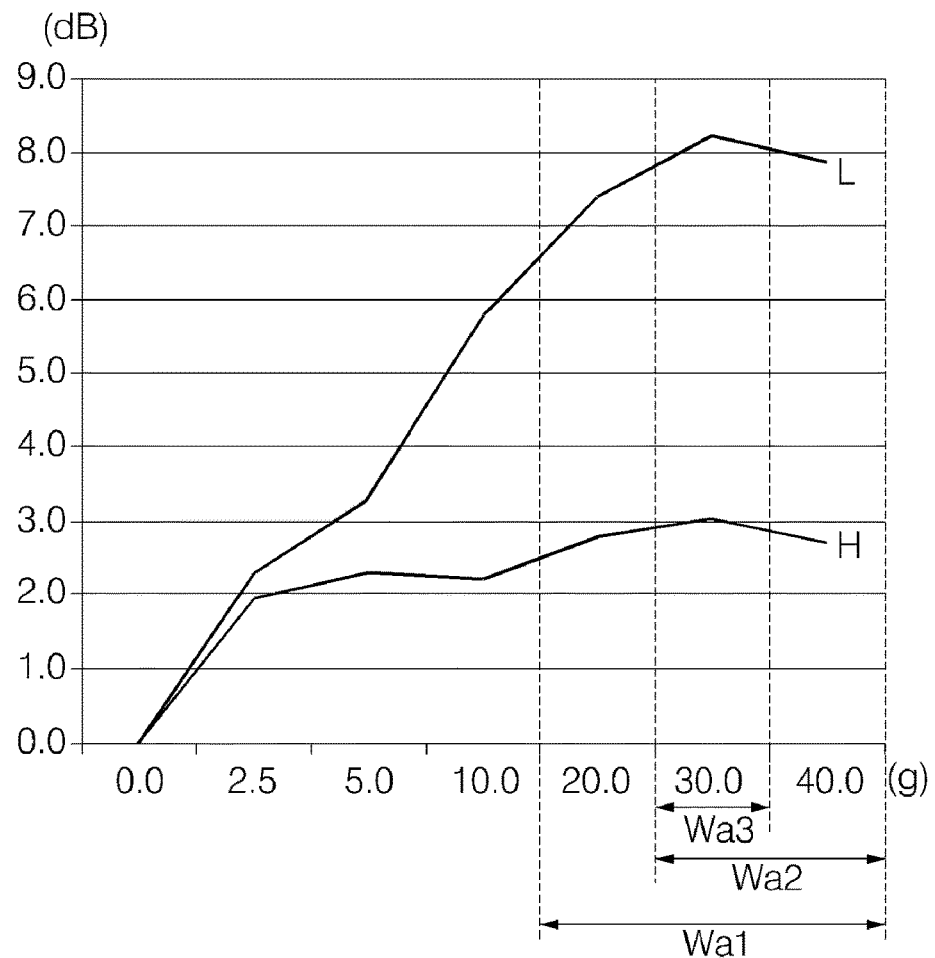
FIG. 13 illustrates a graph and a table showing experimental results of FIGS. 12a to 12f, in which an increase L in an average magnitude of an output in a predetermined low frequency range as compared with the reference graph and an increase H in an average magnitude of an output in a predetermined high frequency range as compared with the reference graph are shown according to the weight W.
Figure 14A:
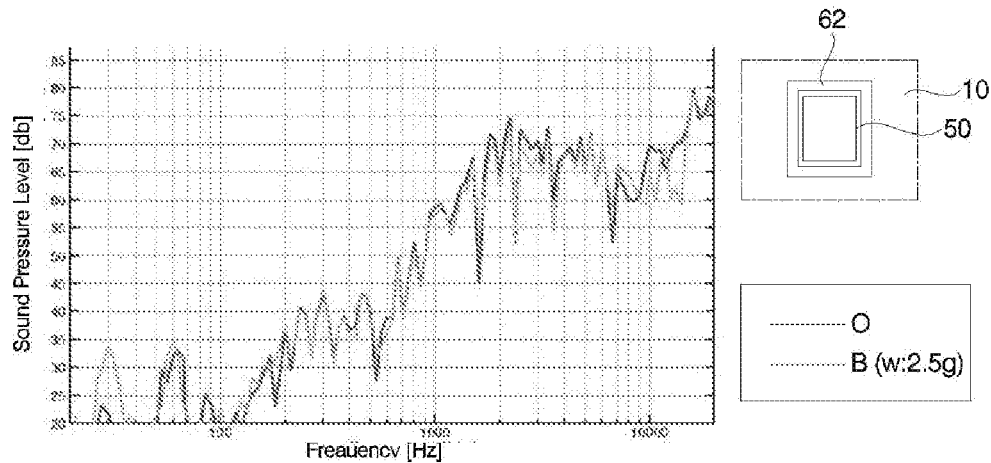
Figure 14B:
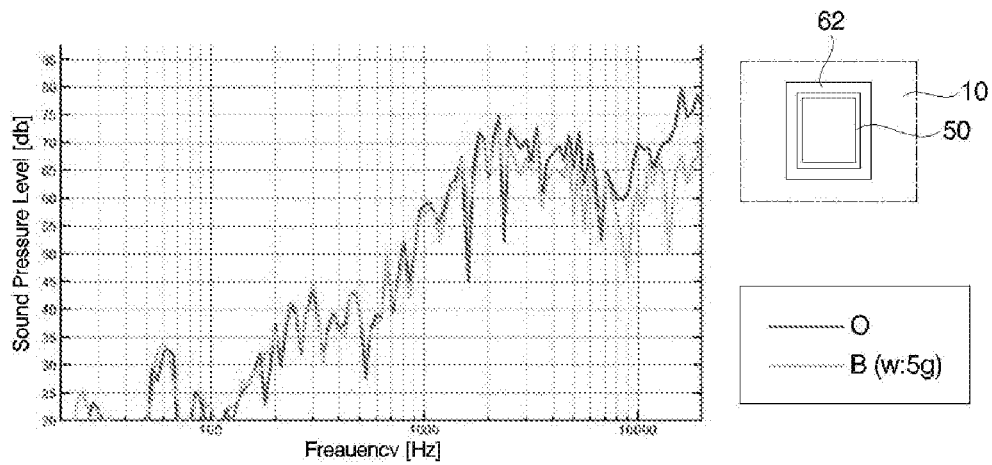
Figure 14C:
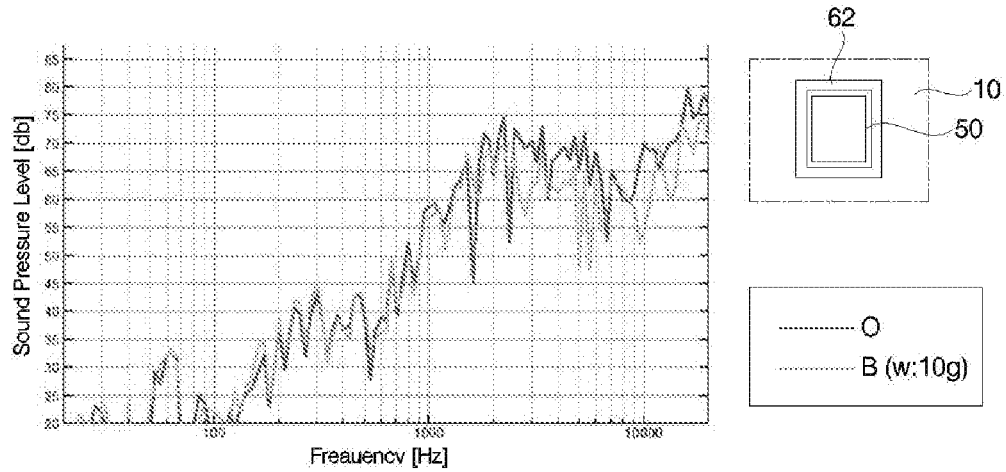
Figure 14D:
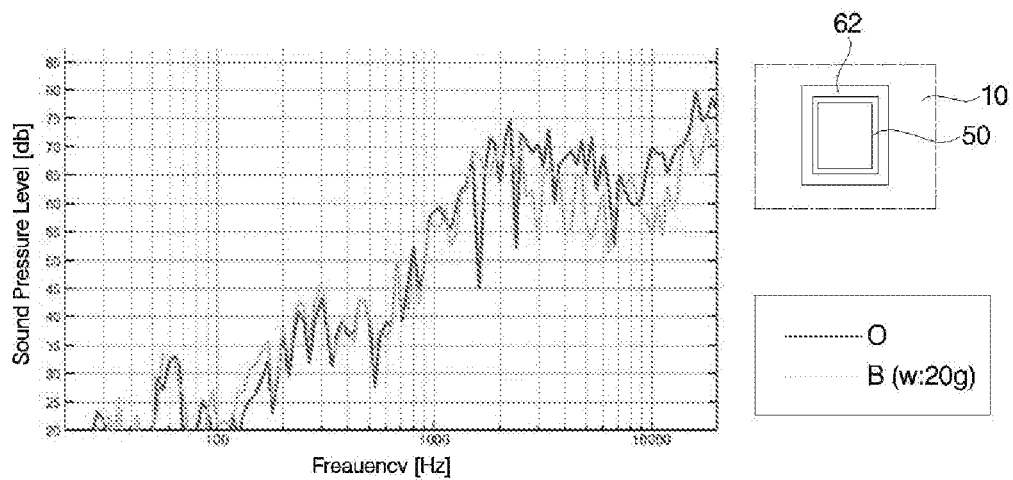
Figure 14E:
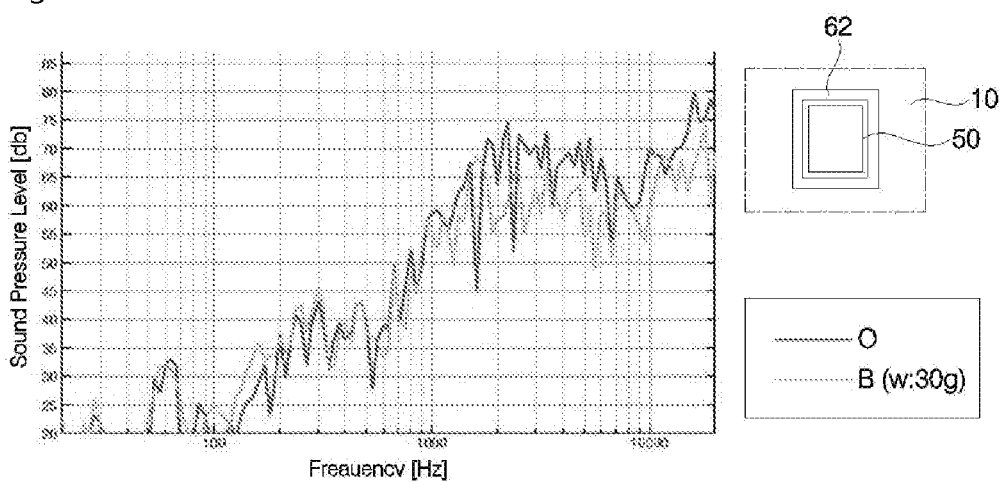
Figure 14F:
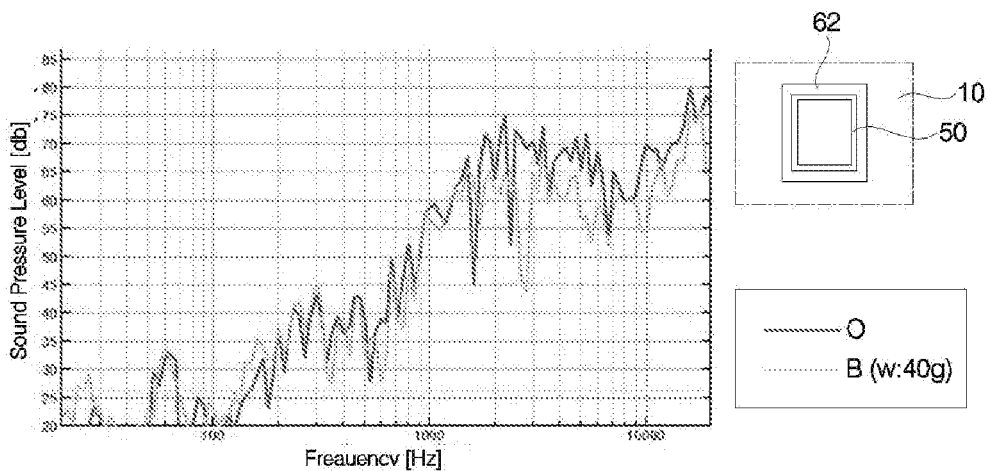

In FIG. 13 and Table 1, W represents the weight of the member in each experimental example, L represents an increase in the magnitude (dB) of the vibration output in the low frequency range of from 100 Hz to 800 Hz (3 octaves) as compared with type O, and H represents an increase in the magnitude (dB) of the vibration output in the high frequency range of from 2,000 Hz to 16,000 Hz (3 octaves) as compared with type O.

Referring to FIG. 13 and Table 1, in order to maximize the increase in the vibration output in the low frequency range, it is preferable for the member 61 in type A to have a weight of from about 15 g to about 45 g. The range of the weight of the member 61 from 15 g to 45 g is indicated by Wa1 in FIG. 13.

Further, referring to FIG. 13 and Table 1, in the range of the weight of the member 61 in type A, which is from about 15 g to about 45 g, the effect of increasing the vibration output in the low frequency range is further improved when the member 61 has a weight of about 25 g or more (a weight of 30 g, at which the value of L is 8.2 dB, or a weight of 40 g, at which the value of L is 7.9 dB, is more advantageous than a weight of 20 g, at which the value of L is 7.4 dB). Specifically, the weight of the member 61 in type A may be set to be from about 25 g to about 45 g. The range of the weight of the member 61 from 25 g to 45 g is indicated by Wa2 in FIG. 13.

Further, referring to FIG. 13 and Table 1, in the range of the weight of the member 61 in type A, which is from about 15 g to about 45 g, the effect of increasing the vibration output in the high frequency range is further improved when the member 61 has a weight of about 35 g or less (a weight of 20 g, at which the value of H is 2.8 dB, or a weight of 30 g, at which the value of H is 3.0 dB, is more advantageous than a weight of 40 g, at which the value of H is 2.7 dB). Specifically, the weight of the member 61 in type A may be set to be from about 15 g to about 35 g.

Furthermore, referring to FIG. 13 and Table 1, in order to maximize the effects of increasing the vibration output in the low frequency range and of increasing the vibration output in the high frequency range, it is preferable for the member 61 in type A to have a weight of from about 25 g to about 35 g (since the value of L and the value of H at a weight of 30 g are larger than the values of L and the values of H at weights of 20 g and 40 g, the weight of 30 g is advantageous). The range of the weight of the member 61 from 25 g to 35 g is indicated by Wa3 in FIG. 13.

Hereinafter, the experimental results according to the weight W of the member 62 in type B will be explained with reference to FIGS. 14a to 14f. The experimental example illustrated in FIG. 14a includes a member 62 having a weight W of 2.5 g. The experimental example illustrated in FIG. 14b includes a member 62 having a weight W of 5 g. The experimental example illustrated in FIG. 14c includes a member 62 having a weight W of 10 g. The experimental example illustrated in FIG. 14d includes a member 62 having a weight W of 20 g. The experimental example illustrated in FIG. 14e includes a member 62 having a weight W of 30 g. The experimental example illustrated in FIG. 14f includes a member 62 having a weight W of 40 g.

The experimental results illustrated in FIGS. 14a to 14f and 15 are shown in the following Table 2.

TABLE 2

| | W (g) | | | | | | |
|---|---|---|---|---|---|---|---|
| | 0.0 | 2.5 | 5.0 | 10.0 | 20.0 | 30.0 | 40.0 |
| L (dB) | 0 | 0.6 | 0.6 | 1.0 | 1.8 | 1.8 | 0.3 |
| H (dB) | 0 | −1.7 | −4.4 | −5.1 | −5.4 | −6.2 | −6.5 |

Figure 15:
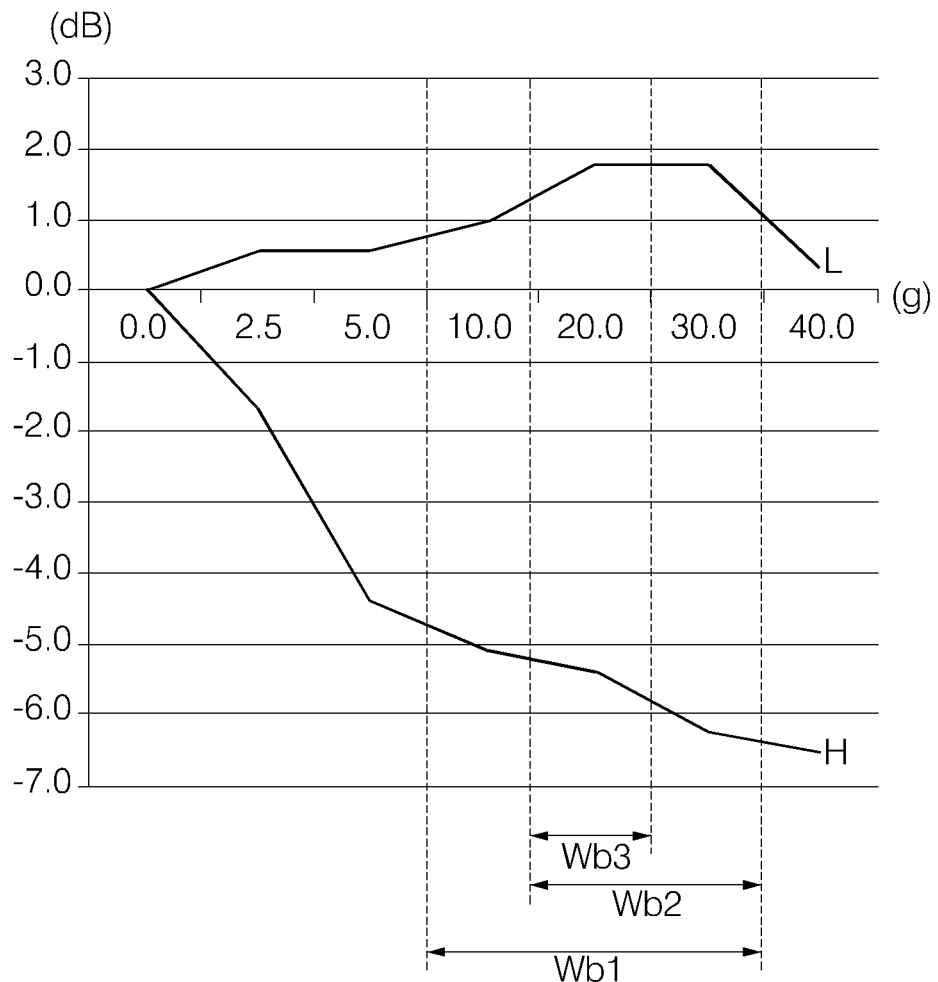
FIG. 15 illustrates a graph and a table showing experimental results of FIGS. 14a to 14f, in which an increase L in an average magnitude of an output in a predetermined low frequency range as compared with the reference graph and an increase H in an average magnitude of an output in a predetermined high frequency range as compared with the reference graph are shown according to the weight W.

In FIG. 15 and Table 2, W represents the weight of the member in each experimental example, L represents an increase in the magnitude (dB) of the vibration output in the low frequency range of from 100 Hz to 800 Hz (3 octaves) as compared with type O, and H represents an increase in the magnitude (dB) of the vibration output in the high frequency range of from 2,000 Hz to 16,000 Hz (3 octaves) as compared with type O.

Referring to FIG. 15 and Table 2, in order to maximize the increase in the vibration output in the low frequency range, it is preferable for the member 62 in type B to have a weight of from about 7.5 g to about 35 g. The range of the weight of the member 62 from 7.5 g to 35 g is indicated by Wb1 in FIG. 15.

Further, referring to FIG. 15 and Table 2, in the range of the weight of the member 62 in type B, which is from about 7.5 g to about 35 g, the effect of increasing the vibration output in the low frequency range is further improved when the member 62 has a weight of about 15 g or more (a weight of 20 g, at which the value of L is 1.8 dB, or a weight of 30 g, at which the value of L is 1.8 dB, is more advantageous than a weight of 10 g, at which the value of L is 1.0 dB). Specifically, the weight of the member 62 in type B may be set to be from about 15 g to about 35 g. The range of the weight of the member 62 from 15 g to 35 g is indicated by Wb2 in FIG. 15.

Furthermore, referring to FIG. 15 and Table 2, in the range of the weight of the member 62 in type B, which is from about 15 g to about 35 g, in order to minimize the reduction of the vibration output in the high frequency range, it is preferable for the member 62 to have a weight of about 25 g or less (a weight of 20 g, at which the value of H is −5.4 dB, is more advantageous than a weight of 30 g, at which the value of H is −6.2 dB). Specifically, the weight of the member 62 in type B may be set to be from about 15 g to about 25 g. The range of the weight of the member 62 from 15 g to 25 g is indicated by Wb3 in FIG. 15.

In type A, type B or type C, the piezoelectric vibration unit 50 is directly attached to the rear surface of the display panel 100. In type D, the piezoelectric vibration unit 50 is attached to the rear surface of the display panel 100 using the damping member 70. In type D, the piezoelectric vibration unit 50 is coupled to the display panel 100 via the damping member 70, which is interposed between the piezoelectric vibration unit 50 and the display panel 100.

The damping member 70 (type D) is attached to the rear surface of the display panel 100. The piezoelectric vibration unit 50 is attached to the rear surface of the damping member 70. The damping member 70 is disposed between the display panel 100 and the piezoelectric vibration unit 50. A peak and dip amplitude at the time at which the piezoelectric vibration unit 50 vibrates when the damping member 70 is present (type D) is decreased below a peak and dip amplitude at the time at which the piezoelectric vibration unit 50 vibrates when the damping member 70 is absent (type O).

Figure 16A:
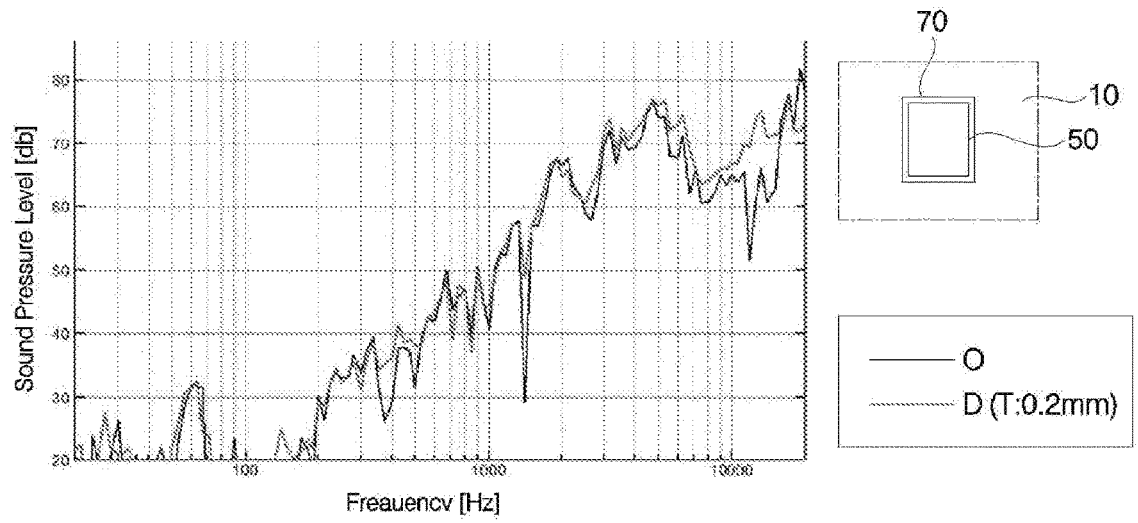
Figure 16B:
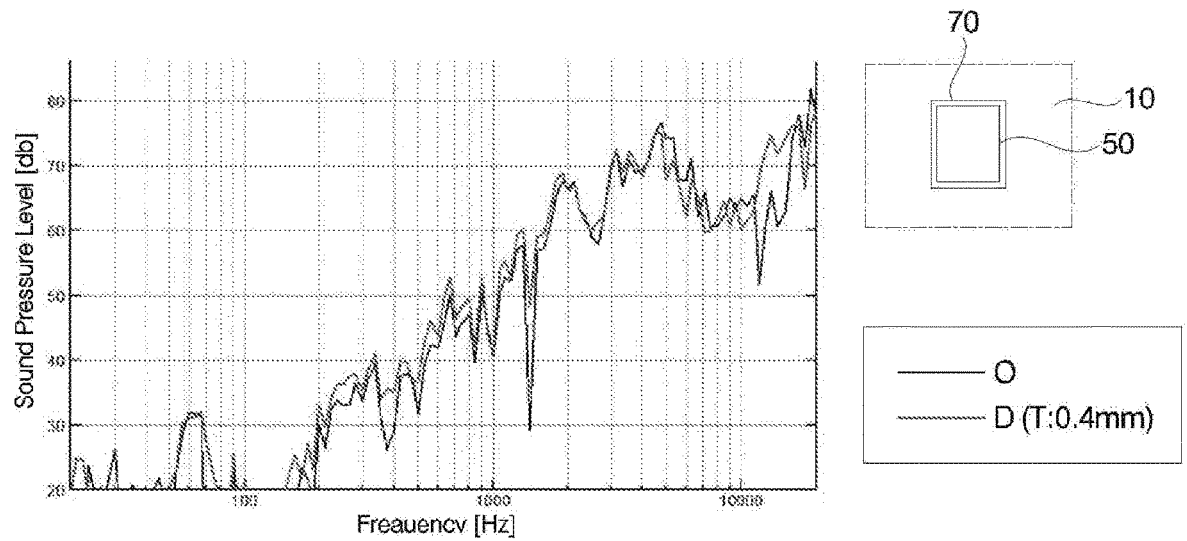
Figure 17:
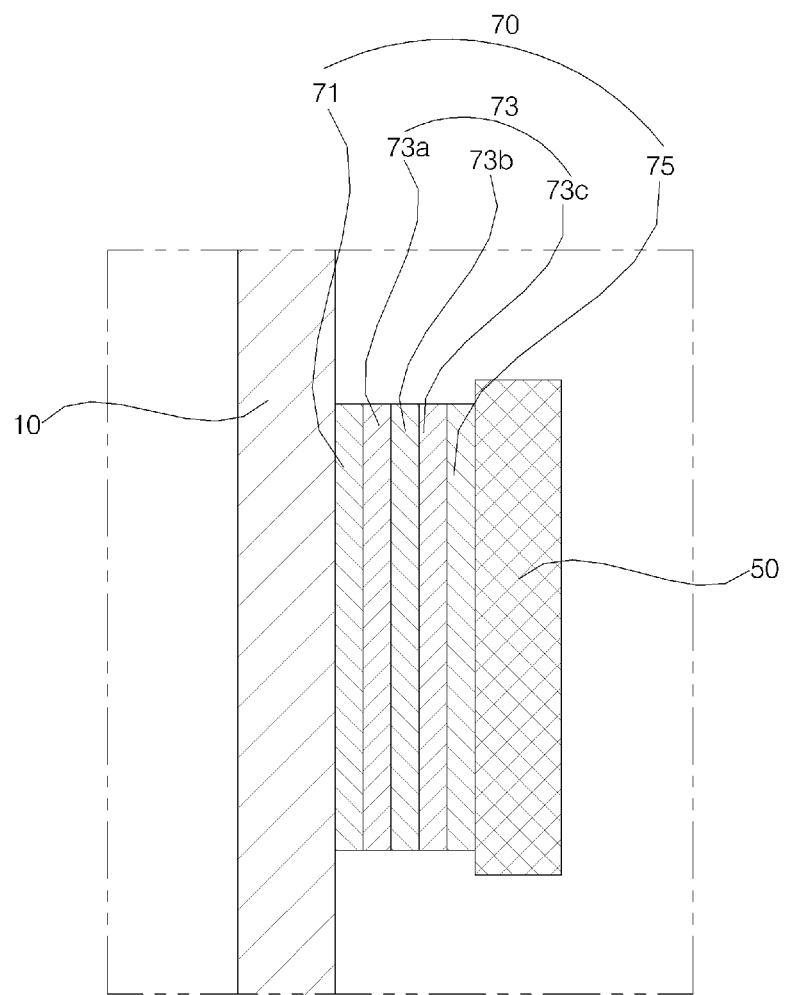
FIG. 17 is an enlarged sectional view of portion E1 depicted in FIG. 3, which shows a concrete example of the damping member 70 in type D.

It can be seen from the experimental examples illustrated in FIGS. 16a and 16b that the problem associated with the generation of peaks and dips is further alleviated in type D than in type O. Specifically, with the increase in the frequency, the degree of fluctuation in the magnitude (dB) of the output becomes smaller in type D than in type O. If the fluctuation of the peak and dip amplitude is decreased, it is possible to more accurately and conveniently control the output of the piezoelectric vibration unit 50 and to uniformly adjust the magnitude of the sound output according to the frequency.

The damping member 70 may be formed to have a quadrangular shape, a circular shape or an elliptical shape when seen from behind. The damping member 70 may be formed in a pad type, which has a substantially constant thickness in the front-rear direction.

The damping member 70 may be formed to have a vertically symmetrical structure with respect to the center of gravity of the piezoelectric vibration unit 50. The damping member 70 may be formed to have a bilaterally symmetrical structure with respect to the center of gravity of the piezoelectric vibration unit 50. The center of gravity of the damping member 70 may lie so as to be aligned with the center of gravity of the piezoelectric vibration unit 50 when seen from behind.

Hereinafter, the experimental results according to the thickness T of the damping member 70 in type D will be explained with reference to FIGS. 16a and 16b. The experimental example illustrated in FIG. 16a includes a damping member 70 having a thickness T of 0.2 mm. The experimental example illustrated in FIG. 16b includes a damping member 70 having a thickness T of 0.4 mm. In any case, the peak and dip amplitude is further decreased. The thickness T of the damping member 70 in the front-rear direction may be set to be from about 0.1 mm to about 0.5 mm. The thickness T of the damping member 70 in the front-rear direction may be thinner than the thickness of the piezoelectric vibration unit 50 in the front-rear direction.

The damping member 70 may have a structure such that two or more damping layers 73, which are formed of different materials from each other, are stacked in the front-rear direction. The damping member 70 may comprise two or more damping layers 73 composed of two or more different materials. The two adjacent damping layers 73a and 73b or 73b and 73c may be formed of different materials from each other. A portion of the wave generated by the piezoelectric vibration unit 50 is reflected by the contact surface (hereinafter, referred to as a "boundary surface") between the two damping layers 73 of different materials, whereas the remaining portion of the wave penetrates the boundary surface, with the result that the amplitude and the wavelength of the wave are changed such that fluctuation of the peak and dip amplitude is decreased. The boundary surface functions to further improve the peak-and-dip-decreasing effect of the damping member 70. The damping member 70 may include a first damping layer 73a, a second damping layer 73b and a third damping layer 73c. These damping layers 73 may be sequentially stacked in the front-rear direction.

The damping member 70 may include a front attachment member 71, which is attached to the rear surface of the display panel 100 so as to support the damping member 70. The first damping layer 73a, which is located at the foremost position, may be attached to the rear surface of the front attachment member 71. The front attachment member 71 may include an adhesive agent.

The damping member 70 may include a rear attachment member 75, which is attached to the front surface of the piezoelectric vibration unit 50 so as to support the piezoelectric vibration unit 50. The third damping layer 73c, which is located at the rearmost position, may be attached to the front surface of the rear attachment member 75. The rear attachment member 75 may include an adhesive agent.

Figure 18:
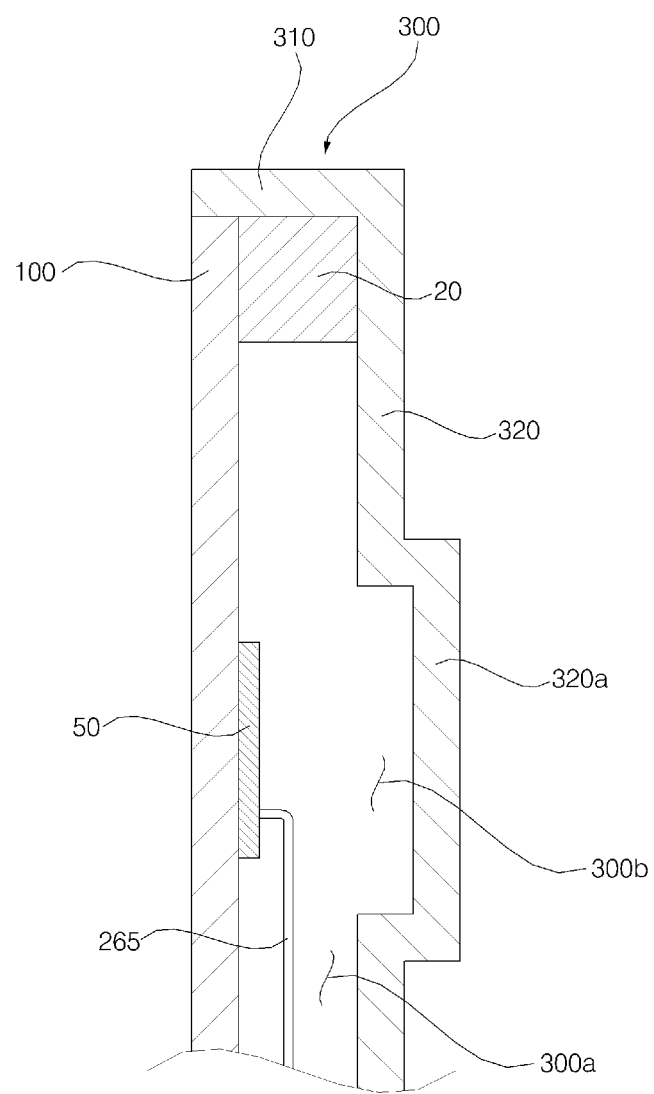
FIG. 18 is a sectional view of an upper portion in FIG. 3, which shows a modified example of a back cover 320 disposed behind the piezoelectric vibration unit 50.

According to a further embodiment illustrated in FIG. 18, the back cover 320 may be formed such that a portion 320a thereof that faces the piezoelectric vibration unit 50 protrudes further backwards than the remaining portion thereof. The region of the inner portion of the cover 300 facing the piezoelectric vibration unit 50 may be rearwardly depressed defining an additional space 300b therebetween. The space 300a between the display panel 100 and the back cover 320 may be expanded further backwards from a region behind the piezoelectric vibration unit 50. A space 300b may be formed behind the piezoelectric vibration unit 50 in a manner such that the rear end of the space 300b is located at a position further backward than the rear end of the space 300a that surrounds the space 300b. That is, the portion 320a of the front surface of the cover 300 that faces the piezoelectric vibration unit 50 may be depressed backwards so as to additionally form the space 300b. Specifically, the space 300b is formed by depressing the portion 320a of the front surface of the back cover 320 backwards. As a result, the sound generated by the piezoelectric vibration unit 50 may be primarily propagated forwards, and the member 60 or the damping member 70 may be arranged so that the member 60 or the piezoelectric vibration unit 50 can be spaced apart from the back cover 320.

As is apparent from the above description, the present invention provides a display apparatus in which the visual or acoustical vibration generation position is located on the display panel, thereby increasing the immersion level of a viewer with respect to the image.

Further, the distance between the visual sound generation position and the acoustical sound generation position is minimized by outputting a sound through direct vibration of the display panel.

Further, the distance between the visual vibration generation position and the tactile vibration generation position is minimized by enabling the user to feel direct vibration of the display panel.

Further, since the gravity load of the piezoelectric vibration unit is totally transferred to the display panel, the vibration generated by the piezoelectric vibration unit is transferred to the display panel without interference with components other than the member and/or the damping member, thereby easily obtaining desired predetermined effects.

Further, the magnitude of the output in the low frequency range of the piezoelectric vibration unit is increased due to the presence of the member.

Further, the effect of increasing the magnitude of the output in the low frequency range is further improved due to the piezoelectric vibration unit of a PZT material.

Further, since two piezoelectric vibration units are disposed within the predetermined region, the position of the sound image is located on the display panel, specifically, at the center portion of the display panel.

Further, the vibration generation effect of the display panel is further improved by using an OLED display panel. Thanks to the OLED display panel, it is possible to manufacture a relatively thin display apparatus. Further, the OLED display panel is advantageous with regard to direct vibration of the display panel and generation of the vibration output due to its flexibility. In addition, since the OLED display panel does not need a backlight module, even if the piezoelectric vibration unit is attached to the rear surface of the display panel, the image output is not influenced.

The increase in the vibration output in the low frequency range of from 100 Hz or 800 Hz is a considerably advantageous effect. This is because the range of from 100 Hz to 800 Hz is a region, in which the vibration output is relatively low when the member is absent in comparison with other frequency ranges of the piezoelectric vibration unit, which has a frequency range of less than or equal to 16,000 Hz, and because the range of from 100 Hz to 800 Hz is a region in which the user can recognize the sound image. Further, since the frequency of the human voice is usually 100 Hz or more, it is very important to increase the vibration output in the low frequency range of greater than or equal to 100 Hz in order to prevent a disconnect between the image and the sound.

Further, the entire area of the piezoelectric vibration unit evenly vibrates and unexpected frequencies are prevented from being output due to the above-described shape, center of gravity or arrangement positions of the member.

Further, the magnitude of the output in the low frequency range of the piezoelectric vibration unit is further increased by attaching the member to the rear surface of the piezoelectric vibration unit.

Further, it is possible to increase the magnitude of the output in the high frequency range as well as the magnitude of the output in the low frequency range of the piezoelectric vibration unit by attaching the member only to the rear surface of the piezoelectric vibration unit. Furthermore, the effect of increasing the magnitude of the output in the high frequency range is further improved by attaching the member to the center portion of the piezoelectric vibration unit.

Further, in order to meet the recent trend of reduction in the thickness of the display apparatus even in increments of 0.1 mm, the member is attached only to a portion of the rear surface of the display panel that surrounds the piezoelectric vibration unit, thereby further reducing the thickness of the display apparatus as well as increasing the magnitude of the output in the low frequency range of the piezoelectric vibration unit. The effect of increasing the magnitude of the output in the low frequency range is further improved due to the above-described arrangement positions of the member.

Further, due to the member having the above-described weight, the effect of increasing the magnitude of the output in the low frequency range is further improved, the effect of increasing the magnitude of the output in the high frequency range is further improved, or the reduction of the output in the high frequency range is minimized while increasing the magnitude of the output in the low frequency range.

Further, fluctuation of a peak and dip amplitude is minimized due to the damping member. It is possible to more accurately and conveniently control the output of the piezoelectric vibration unit and to uniformly adjust the magnitude of the sound output according to the frequency by minimizing the fluctuation of the peak and dip amplitude. Further, the effect of minimizing the fluctuation of the peak and dip amplitude is further improved due to the presence of two or more damping layers. A portion of the wave generated by the piezoelectric vibration unit is reflected by the contact surface between the two damping layers of different materials, whereas the remaining portion of the wave penetrates the contact surface, with the result that the amplitude and the wavelength of the wave are changed such that fluctuation of the peak and dip amplitude is decreased.

Further, the display panel, the piezoelectric vibration unit, the member and the damping member are protected by the cover. Due to the cover, the display apparatus has a neat appearance and improved durability.

Further, an additional space is formed by depressing a portion of the front surface of the cover, which faces the piezoelectric vibration unit, backwards. As a result, the sound generated by the piezoelectric vibration unit is primarily propagated forwards, and the member or the damping member is arranged so that the member or the piezoelectric vibration unit can be easily spaced apart from the back cover.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A display apparatus comprising:
    a display panel;
    at least one piezoelectric vibration unit comprising a first side coupled to a rear side of the display panel;
    a member attached to at least a second side of the piezoelectric vibration unit opposite the first side or a portion of the rear side of the display panel surrounding the piezoelectric vibration unit; and
    a damping member attached to the rear side of the display panel;
    wherein the piezoelectric vibration unit is coupled to the display panel via the damping member interposed between the piezoelectric vibration unit and the display panel,
    wherein the damping member comprises:
    a first adhesive layer attached to the display panel;
    a second adhesive layer attached to the piezoelectric vibration unit; and
    a damping layer between the first adhesive layer and the second adhesive layer and comprising two or more layers formed of two or more different materials.

2. The display apparatus according to claim 1, wherein the member is attached to the second side of the piezoelectric vibration unit.

3. The display apparatus according to claim 1, wherein the member is attached only to the second side of the piezoelectric vibration unit.

4. The display apparatus according to claim 3, wherein the member is attached to a center portion of the second side of the piezoelectric vibration unit.

5. The display apparatus according to claim 3, wherein the member covers an entire area of the second side of the piezoelectric vibration unit.

6. The display apparatus according to claim 3, wherein the weight of the member is in a range of 15 g to 45 g.

7. The display apparatus according to claim 6, wherein the weight of the member is 25 g or more.

8. The display apparatus according to claim 6, wherein the weight of the member is 35 g or less.

9. The display apparatus according to claim 1, wherein the member is attached only to the rear side of the display panel surrounding the piezoelectric vibration unit.

10. The display apparatus according to claim 9, wherein the member is laterally positioned adjacent to at least two sides of the piezoelectric vibration unit.

11. The display apparatus according to claim 9, wherein the member is laterally positioned adjacent to at least two opposite sides of the piezoelectric vibration unit.

12. The display apparatus according to claim 11, wherein the member is laterally positioned adjacent to all sides of the piezoelectric vibration unit.

13. The display apparatus according to claim 9, wherein the weight of the member is in a range of 7.5 g to 35 g.

14. The display apparatus according to claim 13, wherein the weight of the member is 15 g or more.

15. The display apparatus according to claim 14, wherein the weight of the member is 25 g or less.

16. The display apparatus according to claim 1, wherein vibration generated by the piezoelectric vibration unit is transferred to the display panel and causes the display panel to vibrate.

17. The display apparatus according to claim 1, wherein a first side of the member is attached to at least the piezoelectric vibration unit or the portion of the rear side of the display panel, and a second side of the member opposite the first side does not contact any other portion of the display apparatus.

18. The display apparatus according to claim 17, wherein the member comprises multiple weight members.

19. The display apparatus according to claim 1, wherein the piezoelectric vibration unit is composed of lead zirconate titanate.

20. The display apparatus according to claim 1, wherein: the at least one piezoelectric vibration unit includes a first piezoelectric vibration unit and a second piezoelectric vibration unit spaced apart from each other; and the first piezoelectric vibration unit is positioned in an upper left quadrant of the display panel and the second piezoelectric vibration unit is positioned in an upper right quadrant of the display panel.

21. The display apparatus of claim 20, wherein the first piezoelectric vibration unit is positioned in a middle region of the upper left quadrant of the display panel and the second piezoelectric vibration unit is positioned in a middle region of the upper right quadrant of the display panel.

22. The display apparatus according to claim 1, further comprising:
a cover comprising an outer portion configured to support a marginal portion of the display panel, wherein an inner portion of the cover is spaced apart from the rear side of the display panel defining a space therebetween,
wherein a part of the inner portion of the cover facing the piezoelectric vibration unit is rearwardly depressed defining an additional space therebetween.

23. The display apparatus according to claim 1, wherein the member is symmetrical with respect to a center of gravity of the piezoelectric vibration unit.

24. The display apparatus according to claim 1, wherein a center of gravity of the member is aligned with a center of gravity of the piezoelectric vibration unit.

* * * * *